US009369154B2

(12) United States Patent
Song et al.

(10) Patent No.: US 9,369,154 B2
(45) Date of Patent: Jun. 14, 2016

(54) DIGITAL BROADCASTING SYSTEM AND METHOD OF PROCESSING DATA IN DIGITAL BROADCASTING SYSTEM

(71) Applicant: LG ELECTRONICS INC., Seoul (KR)

(72) Inventors: Jae Hyung Song, Seoul (KR); In Hwan Choi, Gwacheon-si (KR); Jong Yeul Suh, Seoul (KR); Jin Pil Kim, Seoul (KR); Chul Soo Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/463,371

(22) Filed: Aug. 19, 2014

(65) Prior Publication Data

US 2014/0355723 A1  Dec. 4, 2014

Related U.S. Application Data

(63) Continuation of application No. 12/962,500, filed on Dec. 7, 2010, now Pat. No. 8,964,856, which is a continuation of application No. 12/198,038, filed on Aug. 25, 2008, now Pat. No. 7,965,778.

(Continued)

(30) Foreign Application Priority Data

Aug. 25, 2008  (KR) .................... 10-2008-0082949

(51) Int. Cl.
*H04N 7/18* (2006.01)
*H03M 13/27* (2006.01)
(Continued)

(52) U.S. Cl.
CPC ........ *H03M 13/2721* (2013.01); *H03M 13/293* (2013.01); *H03M 13/2915* (2013.01);
(Continued)

(58) Field of Classification Search
CPC .. H04W 80/04; H04W 36/18; H04W 36/0011
USPC ........ 375/240.25–240.28; 370/254, 330–335, 370/474, 476; 455/432.1
See application file for complete search history.

(56) References Cited

U.S. PATENT DOCUMENTS 5,208,816 A   5/1993  Seshardi et al.
5,258,987 A  11/1993  Wei
(Continued)

FOREIGN PATENT DOCUMENTS

CN  1463126  12/2003
CN  1496107   5/2004
(Continued)

OTHER PUBLICATIONS

Korean Intellectual Property Office Application Serial No. 10-2008-0083068, Notice of Allowance dated Jun. 24, 2014, 3 pages.
(Continued)

*Primary Examiner* — Andy Rao
(74) *Attorney, Agent, or Firm* — Lee, Hong, Degerman, Kang & Waimey

(57) ABSTRACT

A digital broadcasting system and a data processing method are disclosed. A receiving system of the digital broadcasting system includes a receiving unit, an SI handler, and a decoding unit. The receiving unit receives broadcast signals including mobile service data and main service data. The mobile service data configure a data group, and the data group includes a signaling information region in some of a plurality of data regions. The signaling information region may include TPC signaling data and FIC signaling data. The SI handler acquires channel configuration information of the mobile service data from the broadcast signal using pre-decided IP access information, and extracts encoding format information for each IP stream component within a corresponding virtual channel service RTP-packetized and received from the acquired channel configuration information. The decoding unit decodes the mobile service data of the corresponding IP stream component based upon the extracted encoding format information.

2 Claims, 22 Drawing Sheets

Related U.S. Application Data

(60) Provisional application No. 60/957,714, filed on Aug. 24, 2007, provisional application No. 60/974,084, filed on Sep. 21, 2007, provisional application No. 60/977,379, filed on Oct. 4, 2007, provisional application No. 61/044,504, filed on Apr. 13, 2008, provisional application No. 61/076,684, filed on Jun. 29, 2008, provisional application No. 61/076,686, filed on Jun. 29, 2008.

(51) Int. Cl.

| | |
|---|---|
| H03M 13/29 | (2006.01) |
| H03M 13/35 | (2006.01) |
| H04N 21/414 | (2011.01) |
| H04N 21/434 | (2011.01) |
| H04N 21/438 | (2011.01) |
| H04N 21/61 | (2011.01) |
| H04N 21/6336 | (2011.01) |
| H04N 21/643 | (2011.01) |
| H04N 21/6437 | (2011.01) |
| H04L 1/00 | (2006.01) |
| H04L 29/06 | (2006.01) |
| H04B 7/08 | (2006.01) |
| H03M 13/09 | (2006.01) |
| H04H 20/57 | (2008.01) |
| H04H 60/73 | (2008.01) |

(52) U.S. Cl.
CPC ...... *H03M13/2918* (2013.01); *H03M 13/2921* (2013.01); *H03M 13/2936* (2013.01); *H03M 13/2948* (2013.01); *H03M 13/356* (2013.01); *H04B 7/08* (2013.01); *H04L 1/0045* (2013.01); *H04L 1/0047* (2013.01); *H04L 1/0065* (2013.01); *H04L 65/4076* (2013.01); *H04N 21/41407* (2013.01); *H04N 21/4345* (2013.01); *H04N 21/4382* (2013.01); *H04N 21/6131* (2013.01); *H04N 21/6336* (2013.01); *H04N 21/6437* (2013.01); *H04N 21/64322* (2013.01); *H03M 13/09* (2013.01); *H04H 20/57* (2013.01); *H04H 60/73* (2013.01); *H04L 2001/0093* (2013.01)

(56) References Cited

U.S. PATENT DOCUMENTS

| | | |
|---|---|---|
| 5,301,167 A | 4/1994 | Proakis et al. |
| 5,502,506 A | 3/1996 | Choi |
| 5,508,752 A | 4/1996 | Kim et al. |
| 5,619,269 A | 4/1997 | Lee et al. |
| 5,619,386 A | 4/1997 | Voorman et al. |
| 5,634,138 A | 5/1997 | Ananthan et al. |
| 5,649,284 A | 7/1997 | Yoshinobu |
| 5,691,993 A | 11/1997 | Fredrickson |
| 5,740,205 A | 4/1998 | Baum et al. |
| 5,754,651 A | 5/1998 | Blatter et al. |
| 5,757,416 A | 5/1998 | Birch et al. |
| 5,797,093 A | 8/1998 | Houde |
| 5,805,076 A | 9/1998 | Ito et al. |
| 5,867,503 A | 2/1999 | Ohsuga et al. |
| 5,903,324 A | 5/1999 | Lyons et al. |
| 5,936,949 A | 8/1999 | Pasternak et al. |
| 5,956,373 A | 9/1999 | Goldston et al. |
| 5,978,424 A | 11/1999 | Turner |
| 6,021,421 A | 2/2000 | Retter et al. |
| 6,049,651 A | 4/2000 | Oshima |
| 6,061,826 A | 5/2000 | Thirumoorthy et al. |
| 6,067,457 A | 5/2000 | Erickson et al. |
| 6,091,440 A | 7/2000 | Kokkinen |
| 6,124,898 A | 9/2000 | Patel et al. |
| 6,212,659 B1 | 4/2001 | Zehavi |
| 6,219,386 B1 | 4/2001 | Amrany et al. |
| 6,233,295 B1 | 5/2001 | Wang |
| 6,243,469 B1 | 6/2001 | Kataoka et al. |
| 6,263,466 B1 | 7/2001 | Hinedi et al. |
| 6,266,813 B1 | 7/2001 | Ihara |
| 6,285,681 B1 | 9/2001 | Kolze et al. |
| 6,289,485 B1 | 9/2001 | Shiomoto |
| 6,308,066 B1 | 10/2001 | Ranta et al. |
| 6,314,366 B1 | 11/2001 | Farmakis et al. |
| 6,334,187 B1 | 12/2001 | Kadono |
| 6,339,618 B1 | 1/2002 | Puri et al. |
| 6,370,391 B1 | 4/2002 | Lietsalmi et al. |
| 6,373,534 B1 | 4/2002 | Yasuki et al. |
| 6,396,423 B1 | 5/2002 | Laumen |
| 6,411,253 B1 | 6/2002 | Cox et al. |
| 6,459,741 B1 | 10/2002 | Grabb et al. |
| 6,490,007 B1 | 12/2002 | Bouillet et al. |
| 6,498,936 B1 | 12/2002 | Raith |
| 6,512,759 B1 | 1/2003 | Hashimoto et al. |
| 6,515,713 B1 | 2/2003 | Nam |
| 6,553,538 B2 | 4/2003 | Zehavi |
| 6,573,947 B1 | 6/2003 | Oh |
| 6,628,667 B1 | 9/2003 | Murai et al. |
| 6,651,250 B1 | 11/2003 | Takai |
| 6,665,343 B1 | 12/2003 | Jahanghir et al. |
| 6,671,002 B1 | 12/2003 | Konishi et al. |
| 6,680,952 B1 | 1/2004 | Berg et al. |
| 6,686,880 B1 | 2/2004 | Marko et al. |
| 6,731,700 B1 | 5/2004 | Yaknich et al. |
| 6,734,920 B2 | 5/2004 | Ghosh et al. |
| 6,744,474 B2 | 6/2004 | Markman |
| 6,760,077 B2 | 7/2004 | Choi et al. |
| 6,768,517 B2 | 7/2004 | Limberg et al. |
| 6,775,334 B1 | 8/2004 | Liu et al. |
| 6,775,800 B2 | 8/2004 | Edmonston et al. |
| 6,785,513 B1 | 8/2004 | Sivaprakasam |
| 6,803,970 B1 | 10/2004 | Limberg et al. |
| 6,810,084 B1 | 10/2004 | Jun et al. |
| 6,816,204 B2 | 11/2004 | Limberg |
| 6,917,655 B2 | 7/2005 | Fimoff et al. |
| 6,924,753 B2 | 8/2005 | Bretl et al. |
| 6,927,708 B2 | 8/2005 | Fimoff |
| 6,931,198 B1 | 8/2005 | Hamada et al. |
| 6,944,242 B2 | 9/2005 | Yaknich et al. |
| 6,947,487 B2 | 9/2005 | Choi et al. |
| 6,952,595 B2 | 10/2005 | Ikedo et al. |
| 6,956,619 B2 | 10/2005 | Choi et al. |
| 6,973,137 B2 | 12/2005 | Birru et al. |
| 6,975,689 B1 | 12/2005 | McDonald et al. |
| 6,977,914 B2 | 12/2005 | Paila et al. |
| 6,980,603 B2 | 12/2005 | Choi et al. |
| 6,985,537 B1 | 1/2006 | Milbar |
| 6,993,021 B1 | 1/2006 | Chuah et al. |
| 6,993,062 B1 | 1/2006 | Kong et al. |
| 6,996,133 B2 | 2/2006 | Bretl et al. |
| 7,010,038 B2 | 3/2006 | Choi et al. |
| 7,016,327 B2 | 3/2006 | Grilli et al. |
| 7,016,446 B1 | 3/2006 | Spalink |
| 7,020,481 B2 | 3/2006 | Kivijarvi |
| 7,027,103 B2 | 4/2006 | Choi et al. |
| 7,030,935 B2 | 4/2006 | Choi et al. |
| 7,038,732 B2 | 5/2006 | Limberg et al. |
| 7,042,949 B1 | 5/2006 | Omura et al. |
| 7,085,324 B2 | 8/2006 | Choi et al. |
| 7,092,447 B2 | 8/2006 | Choi et al. |
| 7,092,455 B2 | 8/2006 | Choi et al. |
| 7,102,692 B1 | 9/2006 | Carlsgaard et al. |
| 7,110,449 B2 | 9/2006 | Heo et al. |
| 7,111,221 B2 | 9/2006 | Birru et al. |
| 7,130,313 B2 | 10/2006 | Pekonen |
| 7,148,932 B2 | 12/2006 | Choi et al. |
| 7,151,575 B1 | 12/2006 | Landry et al. |
| 7,194,047 B2 | 3/2007 | Strolle et al. |
| 7,206,352 B2 | 4/2007 | Birru et al. |
| 7,209,459 B2 | 4/2007 | Kangas |
| 7,221,358 B2 | 5/2007 | Sasaki |
| 7,221,680 B2 | 5/2007 | Vijayan et al. |
| 7,343,487 B2 | 3/2008 | Lindqvist et al. |
| 7,359,357 B2 | 4/2008 | Rhee et al. |

(56) References Cited

U.S. PATENT DOCUMENTS

| | | |
|---|---|---|
| 7,376,074 B2 | 5/2008 | Jung et al. |
| 7,430,251 B2 | 9/2008 | Choi et al. |
| 7,440,516 B2 | 10/2008 | Kim et al. |
| 7,450,613 B2 | 11/2008 | Choi et al. |
| 7,460,606 B2 | 12/2008 | Choi et al. |
| 7,486,640 B2 * | 2/2009 | Borsos et al. .................. 370/331 |
| 7,584,495 B2 | 9/2009 | Hannuksela et al. |
| 7,590,187 B2 | 9/2009 | Jeong et al. |
| 7,646,828 B2 | 1/2010 | Song et al. |
| 7,711,045 B2 | 5/2010 | Park et al. |
| 7,792,103 B2 | 9/2010 | Kim et al. |
| 7,933,232 B2 | 4/2011 | Lee et al. |
| 8,165,244 B2 | 4/2012 | Lee et al. |
| 8,490,147 B2 | 7/2013 | Lee et al. |
| 2001/0011213 A1 | 8/2001 | Hindie et al. |
| 2001/0034867 A1 | 10/2001 | Jaffe et al. |
| 2001/0038744 A1 | 11/2001 | Yamada et al. |
| 2002/0080992 A1 | 6/2002 | Decker et al. |
| 2002/0085632 A1 | 7/2002 | Choi et al. |
| 2002/0089078 A1 | 7/2002 | Suzuki et al. |
| 2002/0126222 A1 | 9/2002 | Choi et al. |
| 2002/0136197 A1 | 9/2002 | Owen et al. |
| 2002/0136276 A1 | 9/2002 | Franceschini et al. |
| 2002/0138806 A1 | 9/2002 | Scalise et al. |
| 2002/0150246 A1 | 10/2002 | Ogina |
| 2002/0154709 A1 | 10/2002 | Choi et al. |
| 2002/0157099 A1 | 10/2002 | Schrader et al. |
| 2002/0159520 A1 | 10/2002 | Choi et al. |
| 2002/0172154 A1 | 11/2002 | Uchida et al. |
| 2002/0186790 A1 | 12/2002 | Choi et al. |
| 2002/0187767 A1 | 12/2002 | Meehan |
| 2002/0191716 A1 | 12/2002 | Xia et al. |
| 2002/0194570 A1 | 12/2002 | Birru et al. |
| 2003/0018980 A1 | 1/2003 | Gorbatov et al. |
| 2003/0046431 A1 | 3/2003 | Belleguie |
| 2003/0066082 A1 | 4/2003 | Kliger et al. |
| 2003/0067899 A9 | 4/2003 | Chen et al. |
| 2003/0093798 A1 | 5/2003 | Rogerson |
| 2003/0099303 A1 | 5/2003 | Birru et al. |
| 2003/0115540 A1 | 6/2003 | Bae et al. |
| 2003/0121045 A1 | 6/2003 | Cho |
| 2003/0125033 A1 | 7/2003 | Rindsberg et al. |
| 2003/0152107 A1 | 8/2003 | Pekonen |
| 2003/0193618 A1 | 10/2003 | Patel et al. |
| 2003/0206053 A1 | 11/2003 | Xia et al. |
| 2003/0223519 A1 | 12/2003 | Jeong et al. |
| 2003/0234890 A1 | 12/2003 | Bae et al. |
| 2004/0022307 A1 | 2/2004 | Dale et al. |
| 2004/0028076 A1 | 2/2004 | Strolle et al. |
| 2004/0034491 A1 | 2/2004 | Kim |
| 2004/0061645 A1 | 4/2004 | Seo et al. |
| 2004/0081199 A1 | 4/2004 | Lopez et al. |
| 2004/0090997 A1 | 5/2004 | Choi et al. |
| 2004/0101046 A1 | 5/2004 | Yang et al. |
| 2004/0105507 A1 | 6/2004 | Chang et al. |
| 2004/0110522 A1 | 6/2004 | Howard et al. |
| 2004/0123332 A1 | 6/2004 | Hanson |
| 2004/0125235 A1 | 7/2004 | Kim et al. |
| 2004/0148642 A1 | 7/2004 | Park et al. |
| 2004/0156460 A1 | 8/2004 | Kim et al. |
| 2004/0237024 A1 | 11/2004 | Limberg |
| 2004/0260985 A1 | 12/2004 | Krieger |
| 2005/0013380 A1 | 1/2005 | Kim et al. |
| 2005/0024543 A1 | 2/2005 | Ramaswamy et al. |
| 2005/0049923 A1 | 3/2005 | Tanaka et al. |
| 2005/0054345 A1 | 3/2005 | Lee |
| 2005/0060760 A1 | 3/2005 | Jaffe et al. |
| 2005/0090235 A1 | 4/2005 | Vermola et al. |
| 2005/0097428 A1 | 5/2005 | Chang et al. |
| 2005/0111586 A1 | 5/2005 | Kang et al. |
| 2005/0129132 A1 | 6/2005 | Choi et al. |
| 2005/0157758 A1 | 7/2005 | Yoo |
| 2005/0162886 A1 | 7/2005 | Jeong et al. |
| 2005/0166244 A1 | 7/2005 | Moon |
| 2005/0168641 A1 | 8/2005 | Seo |
| 2005/0175080 A1 | 8/2005 | Bouillett |
| 2005/0249300 A1 | 11/2005 | Jeong et al. |
| 2005/0249301 A1 | 11/2005 | Jeong et al. |
| 2005/0259813 A1 | 11/2005 | Wasilewski et al. |
| 2005/0262419 A1 | 11/2005 | Becker et al. |
| 2005/0271158 A1 | 12/2005 | Birru |
| 2005/0289586 A1 | 12/2005 | Park et al. |
| 2005/0289592 A1 | 12/2005 | Vermola |
| 2006/0007953 A1 | 1/2006 | Vesma et al. |
| 2006/0015914 A1 | 1/2006 | Lee |
| 2006/0018269 A1 | 1/2006 | Agrawal et al. |
| 2006/0029159 A1 | 2/2006 | Oh et al. |
| 2006/0039460 A1 | 2/2006 | Fimoff et al. |
| 2006/0039482 A1 | 2/2006 | Cho |
| 2006/0039503 A1 | 2/2006 | Choi et al. |
| 2006/0052052 A1 | 3/2006 | Jung et al. |
| 2006/0072623 A1 | 4/2006 | Park |
| 2006/0078072 A1 | 4/2006 | Cheon et al. |
| 2006/0104391 A1 | 5/2006 | Choi et al. |
| 2006/0126633 A1 | 6/2006 | Park |
| 2006/0126668 A1 | 6/2006 | Kwon et al. |
| 2006/0126757 A1 | 6/2006 | Choi et al. |
| 2006/0130099 A1 | 6/2006 | Rooyen |
| 2006/0133429 A1 | 6/2006 | Seo et al. |
| 2006/0140301 A1 | 6/2006 | Choi |
| 2006/0146797 A1 | 7/2006 | Lebizay |
| 2006/0146955 A1 | 7/2006 | Choi et al. |
| 2006/0159183 A1 | 7/2006 | Gaddam et al. |
| 2006/0184965 A1 | 8/2006 | Lee et al. |
| 2006/0194536 A1 | 8/2006 | Kim et al. |
| 2006/0223461 A1 | 10/2006 | Laroia et al. |
| 2006/0245488 A1 | 11/2006 | Puputti et al. |
| 2006/0245505 A1 | 11/2006 | Limberg |
| 2006/0245516 A1 | 11/2006 | Simon |
| 2006/0246836 A1 | 11/2006 | Simon |
| 2006/0248563 A1 | 11/2006 | Lee et al. |
| 2006/0253890 A9 | 11/2006 | Park et al. |
| 2006/0262227 A1 | 11/2006 | Jeong |
| 2006/0262744 A1 | 11/2006 | Xu et al. |
| 2006/0262863 A1 | 11/2006 | Park et al. |
| 2006/0268671 A1 | 11/2006 | Coon |
| 2006/0268673 A1 | 11/2006 | Roh et al. |
| 2006/0271991 A1 | 11/2006 | Bae et al. |
| 2006/0285608 A1 | 12/2006 | Kim et al. |
| 2007/0003217 A1 | 1/2007 | Jang |
| 2007/0014379 A1 | 1/2007 | Park et al. |
| 2007/0071110 A1 | 3/2007 | Choi et al. |
| 2007/0079223 A1 | 4/2007 | Mondin et al. |
| 2007/0092043 A1 | 4/2007 | Yu et al. |
| 2007/0101352 A1 | 5/2007 | Rabina |
| 2007/0121681 A1 | 5/2007 | Kang et al. |
| 2007/0121748 A1 | 5/2007 | Park et al. |
| 2007/0127598 A1 | 6/2007 | Kang et al. |
| 2007/0130495 A1 | 6/2007 | Yoon et al. |
| 2007/0140368 A1 | 6/2007 | Kim et al. |
| 2007/0168844 A1 | 7/2007 | Jeong et al. |
| 2007/0172003 A1 | 7/2007 | Kim et al. |
| 2007/0195889 A1 | 8/2007 | Hong et al. |
| 2007/0201544 A1 | 8/2007 | Zhu-Jilian et al. |
| 2007/0206590 A1 | 9/2007 | Baek et al. |
| 2007/0207727 A1 | 9/2007 | Song et al. |
| 2007/0230460 A1 | 10/2007 | Jeong et al. |
| 2007/0230607 A1 | 10/2007 | Yu et al. |
| 2007/0237184 A1 | 10/2007 | Park et al. |
| 2007/0253502 A1 | 11/2007 | Park et al. |
| 2007/0258487 A1 | 11/2007 | Puputti |
| 2007/0268979 A1 | 11/2007 | Chang et al. |
| 2007/0281613 A1 | 12/2007 | Lee et al. |
| 2007/0283412 A1 | 12/2007 | Lie et al. |
| 2007/0297544 A1 | 12/2007 | Choi et al. |
| 2008/0002765 A1 | 1/2008 | Song et al. |
| 2008/0005767 A1 | 1/2008 | Seo |
| 2008/0008155 A1 | 1/2008 | Yoon et al. |
| 2008/0083000 A1 | 4/2008 | Orrell et al. |
| 2008/0095096 A1 | 4/2008 | Cho et al. |
| 2008/0170162 A1 | 7/2008 | Kim et al. |
| 2008/0225799 A1 | 9/2008 | Lee et al. |
| 2008/0239161 A1 | 10/2008 | Kim et al. |
| 2008/0240065 A1 | 10/2008 | Choi et al. |

(56) References Cited

U.S. PATENT DOCUMENTS

| | | |
|---|---|---|
| 2008/0240293 A1 | 10/2008 | Kim et al. |
| 2008/0240297 A1 | 10/2008 | Kim et al. |
| 2008/0246881 A1 | 10/2008 | Kim et al. |
| 2008/0267307 A1 | 10/2008 | Chang et al. |
| 2008/0273589 A1 | 11/2008 | Kim et al. |
| 2009/0013356 A1 | 1/2009 | Doerr et al. |
| 2009/0028079 A1 | 1/2009 | Song et al. |
| 2009/0028081 A1 | 1/2009 | Song et al. |
| 2009/0028230 A1 | 1/2009 | Leitner |
| 2009/0028272 A1 | 1/2009 | Song et al. |
| 2009/0052587 A1 | 2/2009 | Song et al. |
| 2009/0055864 A1 | 2/2009 | Yoo et al. |
| 2009/0059086 A1 | 3/2009 | Lee et al. |
| 2009/0060030 A1 | 3/2009 | Song et al. |
| 2009/0067336 A1 | 3/2009 | Cho et al. |
| 2009/0080405 A1 | 3/2009 | Lee et al. |
| 2009/0080574 A1 | 3/2009 | Choi et al. |
| 2009/0175218 A1 | 7/2009 | Song et al. |
| 2009/0235141 A1 | 9/2009 | Shelby et al. |
| 2009/0252253 A1 | 10/2009 | Choi et al. |
| 2009/0260041 A1 | 10/2009 | McGinn et al. |
| 2009/0265751 A1 | 10/2009 | Limberg |
| 2010/0100793 A1 | 4/2010 | Limberg |
| 2010/0254494 A1 | 10/2010 | Song et al. |
| 2011/0075725 A1 | 3/2011 | Song et al. |

FOREIGN PATENT DOCUMENTS

| | | |
|---|---|---|
| CN | 1678068 | 10/2005 |
| CN | 1736119 | 2/2006 |
| CN | 1738436 | 2/2006 |
| CN | 1829270 | 9/2006 |
| CN | 1946190 | 4/2007 |
| CN | 101018105 | 8/2007 |
| CN | 101018223 | 8/2007 |
| CN | 101022435 | 8/2007 |
| EP | 0996291 | 4/2000 |
| EP | 1085750 | 3/2001 |
| EP | 1528700 | 5/2005 |
| EP | 1566905 | 8/2005 |
| EP | 1628420 | 2/2006 |
| EP | 1768396 | 3/2007 |
| JP | 9-284664 | 10/1997 |
| JP | 11-069253 | 3/1999 |
| JP | 2000224136 | 8/2000 |
| JP | 2001-54031 | 2/2001 |
| JP | 2001274769 | 10/2001 |
| JP | 2002-141877 | 5/2002 |
| JP | 2002218339 | 8/2002 |
| JP | 2003032640 | 1/2003 |
| JP | 2003-134117 | 5/2003 |
| JP | 2003209525 | 7/2003 |
| JP | 2003284037 | 10/2003 |
| JP | 2004-129126 | 4/2004 |
| JP | 2006148543 | 6/2006 |
| JP | 2007-096403 | 4/2007 |
| KR | 100211248 | 4/1999 |
| KR | 1020000040481 | 7/2000 |
| KR | 10-2001-0022306 | 3/2001 |
| KR | 20030026236 | 3/2003 |
| KR | 10-2003-0030175 | 4/2003 |
| KR | 10-2003-0037138 | 5/2003 |
| KR | 1020030062138 | 7/2003 |
| KR | 1020040032282 | 4/2004 |
| KR | 1020040032283 | 4/2004 |
| KR | 1020050036552 | 4/2005 |
| KR | 10-2005-0062867 | 6/2005 |
| KR | 1020050062867 | 6/2005 |
| KR | 1020050065898 | 6/2005 |
| KR | 1020050066954 | 6/2005 |
| KR | 1020050072988 | 7/2005 |
| KR | 10-2005-0093921 | 9/2005 |
| KR | 1020050093921 | 9/2005 |
| KR | 10-2005-0117314 | 12/2005 |
| KR | 1020050112879 | 12/2005 |
| KR | 1020050118206 | 12/2005 |
| KR | 10-2006-0012510 | 2/2006 |
| KR | 10-2006-0013999 | 2/2006 |
| KR | 10-2006-0016582 | 2/2006 |
| KR | 1020060009737 | 2/2006 |
| KR | 1020060012510 | 2/2006 |
| KR | 1020060039728 | 5/2006 |
| KR | 1020060053061 | 5/2006 |
| KR | 1020060055959 | 5/2006 |
| KR | 10-2006-0063867 | 6/2006 |
| KR | 10-2006-0070665 | 6/2006 |
| KR | 20060068989 | 6/2006 |
| KR | 1020060065435 | 6/2006 |
| KR | 1020060068449 | 6/2006 |
| KR | 1020060072573 | 6/2006 |
| KR | 1020060095126 | 8/2006 |
| KR | 1020060095235 | 8/2006 |
| KR | 1020060102160 | 9/2006 |
| KR | 1020060117484 | 11/2006 |
| KR | 1020060133011 | 12/2006 |
| KR | 1020070007995 | 1/2007 |
| KR | 1020070013168 | 1/2007 |
| KR | 1020070015810 | 2/2007 |
| KR | 1020070030739 | 3/2007 |
| KR | 1020070034215 | 3/2007 |
| KR | 100710248 | 4/2007 |
| KR | 1020070055671 | 5/2007 |
| KR | 1020070068015 | 6/2007 |
| KR | 1020070068960 | 7/2007 |
| KR | 1020070075549 | 7/2007 |
| WO | 0044145 | 7/2000 |
| WO | 0045552 | 8/2000 |
| WO | 0105157 | 1/2001 |
| WO | 01/28246 | 4/2001 |
| WO | 03/017254 | 2/2003 |
| WO | 03/049449 | 6/2003 |
| WO | 2004/057873 | 7/2004 |
| WO | 2004/066652 | 8/2004 |
| WO | 2005/032034 | 4/2005 |
| WO | 2005/043403 | 5/2005 |
| WO | 2005/101655 | 10/2005 |
| WO | 2005/109878 | 11/2005 |
| WO | 2006/003531 | 1/2006 |
| WO | 2006003531 | 1/2006 |
| WO | 2007/030590 | 3/2007 |
| WO | 2007/046676 | 4/2007 |
| WO | 2007/089108 | 8/2007 |
| WO | 2008105587 | 9/2008 |
| WO | 2009/038402 | 3/2009 |
| WO | 2009/038405 | 3/2009 |

OTHER PUBLICATIONS

Advanced Television Systems Committee (ATSC), "A/53: ATSC Digital Television Standard, Parts 1-6," XP-008115585, Jan. 2007, pp. 1-136.
European Patent Office Application Serial No. 08778394.0, Search Report dated Oct. 18, 2013, 5 pages.
Fimoff, M., et al.; "E-VSB Map Signaling", IEEE Transactions on Consumer Electronics; vol. 49; Issue 3; pp. 515-518; Aug. 2003.
Advanced Television Systems Committee; "ATSC Standard: Digital Television Standard (A/53), Revision D, Including Amendment No. 1.", Doc A/53D; Jul. 19, 2005.
Uehara, M., et al.; "Transmission Scheme for the Terrestrial ISDB System"; IEEE Transactions on Consumer Electronics; vol. 45; Issue 1; Feb. 1999.
Chernock, Rich; "PSIP Generation and ATSC Stream Monitoring"; WEBE SMPTE, Oct. 8, 2004.
Advanced Television Systems Comitee; "Recommended practice: Guide to the Use of the ATSC Digital Television Standard, Including Corrigendum No. 1"; Doc A/54A; Dec. 4, 2003.
Digital Video Broadcasting (DVB); DVB-H Implementation Guidelines; ETSI TR 102 377 v1.2.1, Nov. 2005.
ISO/IEC: "Information Technology—Generic Coding of Moving Pictures and Associated Audio Information Systems"; ISO/IEC 13818-1: International Standard; Second Edition; Dec. 1, 2000.

(56) References Cited

OTHER PUBLICATIONS

Federal Information Processing Standards Publication 197; Announcing the Advanced Encryption Standard (AES); Nov. 26, 2001.
Graell, A. et al., "Analysis and Design of Rate Compatible Serial Concatenated Convolutional Codes"; Proceedings of the 2005 International Symposium on Information Theory; pp. 607-611; Sep. 4, 2005.
Advanced Television Systems Committee; "ATSC Recommended Practice: E-VSB Implementation Guidelines" ; Doc A/112, Apr. 18, 2006.
Korean Intellectual Property Office Application Serial No. 10-2008-0060491, Notice of Allowance dated Mar. 20, 2014, 3 pages.
Yao, J.,"IP Datacasting and Channel Error Handling With DVB-H"; Proceedings of the 2005 Emerging Information Technology Conference; XP-010856441; Aug. 15, 2005.
Kim, Sung-Hoon, et al.; "Enhanced-x VSB System Development for Improving ATSC Terrestrial DTV Transmission Standard"; IEEE Transactions on Broadcasting, vol. 52, No. 2, Jun. 2006.
Touzni, A, et al. "Enhanced 8-VSB Transmission for North-American HDTV Terrestrial Broadcast"; Proceedings of the 2003 IEEE International Conference on Acoustics, Speech and Signal Processing; vol. 2; pp. 437-440. XP010640975; Apr. 6, 2003.
Gaddam, V. R., et al., "A Newly Proposed ATSC DTV System for Transmitting a Robust Bit-Stream Along With the Standard Bit-Stream", IEEE Transactions on Consumer Electronics, XP001201224; vol. 49; Issue 4; Nov. 2003.
Gupta, N., "The Eureka 147 Digital Audio Broadcasting System Adapted to the U.S.," Massachusetts Institute of Technology (MIT), May 1996, Retrieved online on Jan. 13, 2010 at http://dspace.mit.edu/bitstream/handle/1721.1/38795/35332950.pdf?sequence=1.
Advanced Television Systems Committee; "Program and System Information protocol for Terrestrial Broadcast and Cable (Revision B)"; Doc. A/65B; Mar. 18, 2003.
Fairhurst, G. et al.; "Extensions Formats for Unidirectional Lightweight Encapsulation (ULE) and the Generic Stream Encapsulation (GSE)"; Internet Engineering Task Force; Aug. 2007.
European Telecommunications Standards Institute (ETSI); "Digital Video Broadcasting (DVB); Support for Use of Scrambling and Conditional Access (CA) Within Digital Broadcasting Systems"; ETR 289; Oct. 1996.
European Telecommunications Standards Institute (ETSI); "Digital Audio Broadcasting (DAB); Internet Protocol (IP) Datagram Tunnelling"; ETSI ES 201 735; v1.1.1; (Sep. 2000).
European Telecommunications Standards Institute (ETSI); "Digital Audio Broadcasting (DAB); Conditional Access"; ETSI TS 102 367; v1.1.1 (Jan. 2005).
Chari, M et al.; "FLO Physical Layer: An Overview"; IEEE transactions on Broadcasting; vol. 53, Issue 1, part 2; pp. 145-160; Feb. 26, 2007.
European Telecommunications Standards Institute (ETSI); "Digital Video Broadcasting (DVB); IP Datacast Over DVB-H; Program Specific Information (PSI)/Service Information (SI)"; ETSI TS 102 470 v1.1.1; (Apr. 2006).
European Telecommuniaction Standards Institute (ETSI); Digital Audio Broadcasting (DAB); Distribution Interfaces; Ensemble Transport Interface (ETI); ETSI ETS 300 799; Sep. 1997.
Advanced Television Systems Committee (ATSC); "Candidate Standard: ATSC-M/H Standard, Part 1—Mobile/Handheld Digital Television System (A/153, Part 1:2009)"; Doc. No. S4-130r12; Dec. 31, 2008.
Advanced Television Systems Committee (ATSC); "Candidate Standard: ATSC-M/H Standard, Part 2—Mobile/Handheld Digital Television System (A/153, Part 1:2009)"; Doc. No. S4-131r11; Dec. 31, 2008.
Advanced Television Systems Committee (ATSC); "Candidate Standard: ATSC-M/H Standard, Part 3—Mobile/Handheld Digital Television System (A/153, Part 1:2009)"; Doc. No. S4-132r11; Dec. 31, 2008.
Korean Broadcasting System (KBS); "Technology Trend in DTV RF Transmission"; KBS Broadcast Technical Research; 2007; pp. 73-92.
European Telecommunications Standards Institute (ETSI), "Digital Video Broadcasting (DVB); IP Datacast over DVB-H: Program Specific Information (PSI)/Service Information (SI)," ETSI TS 102 470, Version 1.1.1, Apr. 2006.
Digital Video Broadcasting (DVB), "DVB-H Implementation Guidelines," DVB Document A092, Revision 2, May 2007.
European Telecommunications Standards Institute (ETSI), "Radio Broadcasting Systems; Digital Audio Broadcasting (DAB) to Mobile, Portable and Fixed Receivers," ETSI EN 300 401, Version 1.4.1, Jun. 2006.
European Telecommunications Standards Institute (ETSI), "Digital Audio Broadcasting (DAB); Internet Protocol (IP) Datagram Tunnelling," ETSI EN 201 735, Version 1.1.1, Sep. 2000.
United States Patent and Trademark Office Application U.S. Appl. No. 14/463,371, Office Action dated Nov. 14, 2014, 6 pages.
Korean Intellectual Property Office Application Serial No. 10-2014-0107109, Notice of Allowance dated Sep. 23, 2014, 3 pages.
Intellectual Property Office of India Application Serial No. 149/KOLNP/2010, Office Action dated Nov. 19, 2014, 1 page.
United States Patent and Trademark Office Application U.S. Appl. No. 14/152,742, Office Action dated Sep. 3, 2015, 8 pages.
Intellectual Property Office of India Application Serial No. 576/KOLNP/2010, Office Action dated Dec. 24, 2014, 2 pages.
Korean Intellectual Property Office Application Serial No. 10-2008-0082949, Notice of Allowance dated Jul. 14, 2015, 4 pages.
United States Patent and Trademark Office Application U.S. Appl. No. 14/638,900, Office Action dated Jul. 8, 2015, 10 pages.
ETSI EN 300 744: "Digital Video Broadcasting (DVB); Framing Structure, channel coding and modulation for digital terrestrial televison (DVB-T)" V1.21 (Jul. 1997).
ETSI EN 300 468: "Digital Video Broadcasting (DVB); Specification for Service Information (SI) in DVB Systems" V1.3.3 (Feb. 1998).
United States Patent and Trademark Office Application U.S. Appl. No. 14/152,742, Office Action dated Feb. 10, 2016, 10 pages.

* cited by examiner

| Syntax | # of bits |
|---|---|
| FIC_Segment () { | |
|    FIC_type | 2 |
|    Reserved | 5 |
|    error_indicator | 1 |
|    FIC_seg_number | 4 |
|    FIC_last_seg_number | 4 |
|    for (i=0;i<N;i++) { | |
|      data_byte | 8 |
|    } | |
| } | |

FIG. 16

| | Syntax | # of bits |
|---|---|---|
| A first region | if (FIC_seg_number == 0) { | |
| |   current_next_indicator | 1 |
| |   Reserved | 2 |
| |   ESG_version | 5 |
| |   transport_stream_id | 16 |
| | } | |
| A second region | while ( ensemble_id ! = 0xFF ) | |
| |   ensemble_id | 8 |
| |   reserved | 3 |
| |   SI_version | 5 |
| |   num_channel | 3 |
| A third region |   for (i=0;i< num_channel;i++) { | |
| |     channel_type | 5 |
| |     channel_activity | 2 |
| |     CA_indicator | 1 |
| |     Stand_alone_Service_indicator | |
| |     major_channel_num | 8 |
| |     minor_channel_num | 8 |
| |   } | |
| | } // end of while | |
| | } | |

FIG. 17

| Syntax | No. of Bits | Format |
|---|---|---|
| service_map_table_section() { | | |
|   table_id | 8 | TBD |
|   section_syntax_indicator | 1 | '0' |
|   private_indicator | 1 | '1' |
|   reserved | 2 | '11' |
|   section_length | 12 | uimsbf |
|   reserved | 3 | '111' |
|   version_number | 5 | uimsbf |
|   section_number | 8 | uimsbf |
|   last_section_number | 8 | uimsbf |
|   SMT_protocol_version | 8 | uimsbf |
|   ensemble_id | 8 | uimsbf |
|   num_channels | 8 | uimsbf |
|   for (i=0; i<num_channels; i++) | | |
|   { | | |
|     major_channel_number | 8 | uimsbf |
|     minor_channel_number | 8 | uimsbf |
|     short_channel_name | 8*8 | |
|     service_id | 16 | uimsbf |
|     service_type | 6 | uimsbf |
|     virtual_channel_activity | 2 | uimsbf |
|     num_components | 5 | uimsbf |
|     IP_version_flag | 1 | bslbf |
|     source_IP_address_flag | 1 | bslbf |
|     virtual_channel_target_IP_address_flag | 1 | bslbf |
|     if (source_IP_address_flag) | | |
|       source_IP_address | 32 or 128 | uimsbf |
|     if (virtual_channel_target_IP_address_flag) | | |
|       virtual_channel_target_IP_address | 32 or 128 | uimsbf |
|     for (j=0; j<num_components; j++) | | |
|     { | | |
|       RTP_payload_type | 7 | uimsbf |
|       component_target_IP_address_flag | 1 | bslbf |
|       if (component_target_IP_address_flag) | | |
|         component_target_IP_address | 32 or 128 | uimsbf |
|       reserved | 2 | '11' |
|       port_num_count | 6 | uimsbf |
|       target_UDP_port_num | 16 | uimsbf |
|       descriptors_length | 8 | uimsbf |
|       for (k=0; k<descriptors_length; k++) | | |
|       { | | |
|         component_level_descriptor() | | |
|       } | | |
|     } | | |
|     descriptors_length | 8 | uimsbf |
|     for (m=0; m<descriptors_length; m++) | | |
|     { | | |
|       virtual_channel_level_descriptor() | | |
|     } | | |
|   } | | |
|   descriptors_length | 8 | uimsbf |
|   for (n=0; n<descriptors_length; n++) { | | |
|   { | | |
|     ensemble_level_descriptor() | | |
|   } ensemble_level_descriptor() | | |
| } | | |

FIG. 18

| Syntax | No. of Bits | Format |
|---|---|---|
| MH_audio_descriptor() { | | |
|     descriptor_tag | 8 | TBD |
|     descriptor_length | 8 | uimsbf |
|     channel_configuration | 8 | uimsbf |
|     reserved | 5 | '11111' |
|     sample_rate_code | 3 | uimsbf |
|     reserved | 2 | '11' |
|     bit_rate_code | 6 | uimsbf |
|     ISO_639_language_code | 3*8 | uimsbf |
| } | | |

FIG. 19

| Syntax | No. of Bits | Format |
|---|---|---|
| MH_current_event_descriptor() { | | |
|     descriptor_tag | 8 | TBD |
|     descriptor_length | 8 | uimsbf |
|     current_event_start_time | 4*8 | uimsbf |
|     current_event_duration | 3*8 | uimsbf |
|     Title_length | 8 | uimsbf |
|     Title_text() | var | |
| } | | |

FIG. 20

| Syntax | No. of Bits | Format |
|---|---|---|
| MH_next_event_descriptor() { | | |
|   descriptor_tag | 8 | TBD |
|   descriptor_length | 8 | uimsbf |
|   next_event_start_time | 4*8 | uimsbf |
|   next_event_duration | 3*8 | uimsbf |
|   title_length | 8 | uimsbf |
|   title_text() | var | |
| } | | |

FIG. 21

| Syntax | No. of Bits | Format |
|---|---|---|
| MH_system_time_descriptor() { | | |
|   descriptor_tag | 8 | TBD |
|   descriptor_length | 8 | uimsbf |
|   system_time | 32 | uimsbf |
|   GPS_UTC_offset | 8 | uimsbf |
|   time_zone_offset_polarity_rate_code | 1 | bslbf |
|   time_zone_offset | 31 | uimsbf |
|   daylight_savings() | 16 | uimsbf |
|   time_zone() | 5*8 | |
| } | | |

FIG. 24

| Syntax | No. of Bits | Format |
|---|---|---|
| MH_RTP_payload_type_descriptor() { | | |
|    descriptor_tag | 8 | TBD |
|    descriptor_length | 8 | uimsbf |
|    reserved | 1 | '1' |
|    RTP_payload_type | 7 | uimsbf |
|    MIME_type_length | 8 | uimsbf |
|    MIME_type() | var | |
| } | | |

DIGITAL BROADCASTING SYSTEM AND METHOD OF PROCESSING DATA IN DIGITAL BROADCASTING SYSTEM

CROSS-REFERENCE TO RELATED APPLICATIONS

This application is a continuation of U.S. application Ser. No. 12/962,500, filed on Dec. 7, 2010, now U.S. Pat. No. 8,964,856, which is a continuation of U.S. application Ser. No. 12/198,038, filed on Aug. 25, 2008, now U.S. Pat. No. 7,965,778, which claims the benefit of earlier filing date and right of priority to Korean Patent Application No. 10-2008-0082949, filed on Aug. 25, 2008, and also claims the benefit of U.S. Provisional patent application Ser. Nos. 61/076,686, filed on Jun. 29, 2008, 61/076,684, filed on Jun. 29, 2008, 61/044,504 filed on Apr. 13, 2008, 60/977,379, filed on Oct. 4, 2007, 60/974,084, filed on Sep. 21, 2007, and 60/957,714, filed on Aug. 24, 2007, the contents of which are hereby incorporated by reference herein in their entirety.

BACKGROUND OF THE INVENTION

1. Field of the Invention

The present invention relates to a digital broadcasting system and a method of processing data in a digital broadcasting system for transmitting and receiving digital broadcast signals.

2. Discussion of the Related Art

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, an object of the present invention is to provide a digital broadcasting system and a data processing method that are highly resistant to channel changes and noise.

Another object of the present invention is to provide a receiving system and a data processing method that can receive and process encoding format information of an IP stream component, which is RTP packetized and received.

To achieve these objects and other advantages and in accordance with the purpose of the invention, as embodied and broadly described herein, a receiving system includes a receiving unit, a system information (SI) handler, and a decoding unit. The receiving unit receives broadcast signals including mobile service data and main service data. Herein, the mobile service data may configure a data group, and the data group may include a signaling information region in some of a plurality of data regions. Also, the signaling information region may include transmission parameter channel (TPC) signaling data and fast information channel (FIC) signaling data. The system information (SI) handler acquires channel configuration information of the mobile service data from the broadcast signal using pre-decided internet protocol (IP) access information, and extracts encoding format information for each IP stream component within a corresponding virtual channel service real-time transport protocol (RTP)-packetized and received from the acquired channel configuration information. The decoding unit decodes the mobile service data of the corresponding IP stream component based upon the extracted encoding format information.

Additionally, the receiving unit may further include a known sequence detector detecting a known data sequence included in the data group. And, herein, the detected known data sequence may be used for demodulating and channel-equalizing the mobile service data. The receiving unit may refer to the fast information channel (FIC) signaling data so as to only acquire slots including data groups requested to be received using a time-slicing method. The channel configuration information may correspond to a service map table (SMT). Herein, the encoding format information may be included in the SMT in any one of a field format and a descriptor format, thereby being received.

When an RTP_payload_type field included in the SMT is assigned with a value within a first value range, the SI handler may extract a pre-stored encoding format information respective of the RTP_payload_type field value. On the other hand, when an RTP_payload_type field included in the SMT is assigned with a value within a second value range, the SI handler may parse the RTP payload type descriptor matching the RTP_payload_type field value from the SMT, so as to extract the encoding format information of the corresponding IP stream component. The encoding format information may be included in the RTP payload type descriptor as a MIME type.

In another aspect of the present invention, a method for processing data in a digital broadcast receiving system includes receiving broadcast signals including mobile service data and main service data, wherein the mobile service data configure a data group, wherein the data group includes a signaling information region in some of a plurality of data regions, and wherein the signaling information region includes transmission parameter channel (TPC) signaling data and fast information channel (FIC) signaling data, acquiring channel configuration information of the mobile service data from the broadcast signal using pre-decided internet protocol (IP) access information, and extracting encoding format information for each IP stream component within a corresponding virtual channel service real-time transport protocol (RTP)-packetized and received from the acquired channel configuration information, and decoding the mobile service data of the corresponding IP stream component based upon the extracted encoding format information.

Additional advantages, objects, and features of the invention may be realized and attained by the structure particularly pointed out in the written description as well as the appended drawings.

BRIEF DESCRIPTION OF THE DRAWINGS

FIG. 8 illustrates an exemplary order of data groups being assigned to one of 5 sub-frames configuring an MH frame according to the present invention;

FIG. 15 illustrates an exemplary bit stream syntax structure with respect to an FIC segment according to an embodiment of the present invention;

FIG. 16 illustrates an exemplary bit stream syntax structure with respect to a payload of an FIC segment according to the present invention, when an FIC type field value is equal to '0';

FIG. 17 illustrates an exemplary bit stream syntax structure of a service map table according to the present invention;

FIG. 18 illustrates an exemplary bit stream syntax structure of an MH audio descriptor according to the present invention;

FIG. 19 illustrates an exemplary bit stream syntax structure of an MH current event descriptor according to the present invention;

FIG. 20 illustrates an exemplary bit stream syntax structure of an MH next event descriptor according to the present invention;

FIG. 21 illustrates an exemplary bit stream syntax structure of an MH system time descriptor according to the present invention;

FIG. 24 illustrates an exemplary bit stream syntax structure of an MH RTP payload type descriptor according to the present invention.

DETAILED DESCRIPTION OF THE INVENTION

Figure 1:
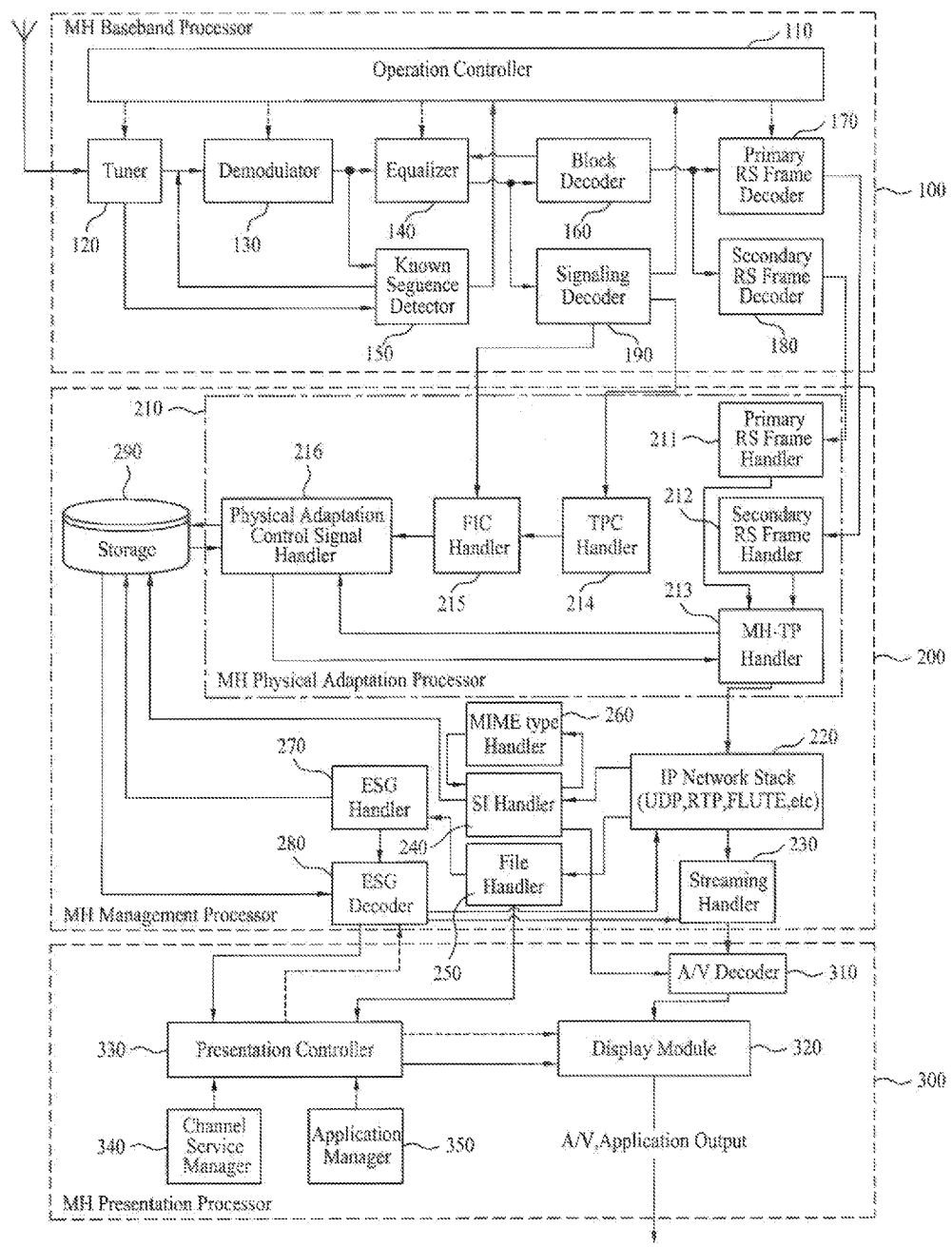
FIG. 1 illustrates a block diagram showing a general structure of a digital broadcasting receiving system according to an embodiment of the present invention.

Reference will now be made in detail to the preferred embodiments of the present invention, examples of which are illustrated in the accompanying drawings. Hereinafter, the preferred embodiment of the present invention will be described with reference to the accompanying drawings. At this time, it is to be understood that the following detailed description of the present invention illustrated in the drawings and described with reference to the drawings are exemplary and explanatory and technical spirits of the present invention and main features and operation of the present invention will not be limited by the following detailed description.

DEFINITION OF THE TERMS USED IN THE PRESENT INVENTION

Although general terms, which are widely used considering functions in the present invention, have been selected in the present invention, they may be changed depending on intention of those skilled in the art, practices, or new technology. Also, in specific case, the applicant may optionally select the terms. In this case, the meaning of the terms will be described in detail in the description part of the invention. Therefore, it is to be understood that the terms should be defined based upon their meaning not their simple title and the whole description of the present invention.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

Additionally, among the terms used in the present invention, "MH" corresponds to the initials of "mobile" and "handheld" and represents the opposite concept of a fixed-type system. Furthermore, the MH service data may include at least one of mobile service data and handheld service data, and will also be referred to as "mobile service data" for simplicity. Herein, the mobile service data not only correspond to MH service data but may also include any type of service data with mobile or portable characteristics. Therefore, the mobile service data according to the present invention are not limited only to the MH service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service data corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

In the present invention, the transmitting system provides backward compatibility in the main service data so as to be received by the conventional receiving system. Herein, the main service data and the mobile service data are multiplexed to the same physical channel and then transmitted.

Furthermore, the transmitting system according to the present invention performs additional encoding on the mobile service data and inserts the data already known by the receiving system and transmitting system (e.g., known data), thereby transmitting the processed data.

Therefore, when using the transmitting system according to the present invention, the receiving system may receive the mobile service data during a mobile state and may also receive the mobile service data with stability despite various distortion and noise occurring within the channel.

Receiving System

FIG. 1 illustrates a block diagram showing a general structure of a receiving system according to an embodiment of the present invention. The receiving system according to the present invention includes a baseband processor 100, a management processor 200, and a presentation processor 300.

The baseband processor 100 includes an operation controller 110, a tuner 120, a demodulator 130, an equalizer 140, a known sequence detector (or known data detector) 150, a block decoder (or mobile handheld block decoder) 160, a primary Reed-Solomon (RS) frame decoder 170, a secondary RS frame decoder 180, and a signaling decoder 190.

The operation controller 110 controls the operation of each block included in the baseband processor 100.

By tuning the receiving system to a specific physical channel frequency, the tuner 120 enables the receiving system to receive main service data, which correspond to broadcast signals for fixed-type broadcast receiving systems, and mobile service data, which correspond to broadcast signals for mobile broadcast receiving systems. At this point, the tuned frequency of the specific physical channel is downconverted to an intermediate frequency (IF) signal, thereby being outputted to the demodulator 130 and the known sequence detector 140. The passband digital IF signal being outputted from the tuner 120 may only include main service data, or only include mobile service data, or include both main service data and mobile service data.

The demodulator 130 performs self-gain control, carrier recovery, and timing recovery processes on the passband digital IF signal inputted from the tuner 120, thereby translating the IF signal to a baseband signal. Then, the demodulator 130 outputs the baseband signal to the equalizer 140 and the known sequence detector 150. The demodulator 130 uses the known data symbol sequence inputted from the known sequence detector 150 during the timing and/or carrier recovery, thereby enhancing the demodulating performance.

The equalizer 140 compensates channel-associated distortion included in the signal demodulated by the demodulator 130. Then, the equalizer 140 outputs the distortion-compensated signal to the block decoder 160. By using a known data symbol sequence inputted from the known sequence detector 150, the equalizer 140 may enhance the equalizing performance. Furthermore, the equalizer 140 may receive feedback on the decoding result from the block decoder 160, thereby enhancing the equalizing performance.

The known sequence detector 150 detects known data place (or position) inserted by the transmitting system from the input/output data (i.e., data prior to being demodulated or data being processed with partial demodulation). Then, the known sequence detector 150 outputs the detected known data position information and known data sequence generated from the detected position information to the demodulator 130 and the equalizer 140. Additionally, in order to allow the block decoder 160 to identify the mobile service data that have been processed with additional encoding by the transmitting system and the main service data that have not been processed with any additional encoding, the known sequence detector 150 outputs such corresponding information to the block decoder 160.

If the data channel-equalized by the equalizer 140 and inputted to the block decoder 160 correspond to data processed with both block-encoding and trellis-encoding by the transmitting system (i.e., data within the RS frame, signaling data), the block decoder 160 may perform trellis-decoding and block-decoding as inverse processes of the transmitting system. On the other hand, if the data channel-equalized by the equalizer 140 and inputted to the block decoder 160 correspond to data processed only with trellis-encoding and not block-encoding by the transmitting system (i.e., main service data), the block decoder 160 may perform only trellis-decoding.

The signaling decoder 190 decoded signaling data that have been channel-equalized and inputted from the equalizer 140. It is assumed that the signaling data inputted to the signaling decoder 190 correspond to data processed with both block-encoding and trellis-encoding by the transmitting system. Examples of such signaling data may include transmission parameter channel (TPC) data and fast information channel (FIC) data. Each type of data will be described in more detail in a later process. The FIC data decoded by the signaling decoder 190 are outputted to the FIC handler 215. And, the TPC data decoded by the signaling decoder 190 are outputted to the TPC handler 214.

Meanwhile, according to the present invention, the transmitting system uses RS frames by encoding units. Herein, the RS frame may be divided into a primary RS frame and a secondary RS frame. However, according to the embodiment of the present invention, the primary RS frame and the secondary RS frame will be divided based upon the level of importance of the corresponding data.

The primary RS frame decoder 170 receives the data outputted from the block decoder 160. At this point, according to the embodiment of the present invention, the primary RS frame decoder 170 receives only the mobile service data that have been Reed-Solomon (RS)-encoded and/or cyclic redundancy check (CRC)-encoded from the block decoder 160. Herein, the primary RS frame decoder 170 receives only the mobile service data and not the main service data. The primary RS frame decoder 170 performs inverse processes of an RS frame encoder (not shown) included in the transmitting system, thereby correcting errors existing within the primary RS frame. More specifically, the primary RS frame decoder 170 forms a primary RS frame by grouping a plurality of data groups and, then, correct errors in primary RS frame units. In other words, the primary RS frame decoder 170 decodes primary RS frames, which are being transmitted for actual broadcast services.

Additionally, the secondary RS frame decoder 180 receives the data outputted from the block decoder 160. At this point, according to the embodiment of the present invention, the secondary RS frame decoder 180 receives only the mobile service data that have been RS-encoded and/or CRC-encoded from the block decoder 160. Herein, the secondary RS frame decoder 180 receives only the mobile service data and not the main service data. The secondary RS frame decoder 180 performs inverse processes of an RS frame encoder (not shown) included in the transmitting system, thereby correcting errors existing within the secondary RS frame. More specifically, the secondary RS frame decoder 180 forms a secondary RS frame by grouping a plurality of data groups and, then, correct errors in secondary RS frame units. In other words, the secondary RS frame decoder 180 decodes secondary RS frames, which are being transmitted for mobile audio service data, mobile video service data, guide data, and so on.

Meanwhile, the management processor 200 according to an embodiment of the present invention includes an MH physical adaptation processor 210, an IP network stack 220, a streaming handler 230, a system information (SI) handler 240, a file handler 250, a multi-purpose internet main extensions (MIME) type handler 260, and an electronic service guide (ESG) handler 270, and an ESG decoder 280, and a storage unit 290.

The MH physical adaptation processor 210 includes a primary RS frame handler 211, a secondary RS frame handler 212, an MH transport packet (TP) handler 213, a TPC handler 214, an FIC handler 215, and a physical adaptation control signal handler 216.

The TPC handler 214 receives and processes baseband information required by modules corresponding to the MH physical adaptation processor 210. The baseband information is inputted in the form of TPC data. Herein, the TPC handler 214 uses this information to process the FIC data, which have been sent from the baseband processor 100.

The TPC data are transmitted from the transmitting system to the receiving system via a predetermined region of a data group. The TPC data may include at least one of an MH ensemble ID, an MH sub-frame number, a total number of MH groups (TNoG), an RS frame continuity counter, a column size of RS frame (N), and an FIC version number.

Herein, the MH ensemble ID indicates an identification number of each MH ensemble carried in the corresponding channel.

The MH sub-frame number signifies a number identifying the MH sub-frame number in an MH frame, wherein each MH group associated with the corresponding MH ensemble is transmitted.

The TNoG represents the total number of MH groups including all of the MH groups belonging to all MH parades included in an MH sub-frame.

The RS frame continuity counter indicates a number that serves as a continuity counter of the RS frames carrying the corresponding MH ensemble. Herein, the value of the RS frame continuity counter shall be incremented by 1 modulo 16 for each successive RS frame.

N represents the column size of an RS frame belonging to the corresponding MH ensemble. Herein, the value of N determines the size of each MH TP.

Finally, the FIC version number signifies the version number of an FIC carried on the corresponding physical channel.

As described above, diverse TPC data are inputted to the TPC handler 214 via the signaling decoder 190 shown in FIG. 1. Then, the received TPC data are processed by the TPC handler 214. The received TPC data may also be used by the FIC handler 215 in order to process the FIC data.

The FIC handler 215 processes the FIC data by associating the FIC data received from the baseband processor 100 with the TPC data.

The physical adaptation control signal handler 216 collects FIC data received through the FIC handler 215 and SI data received through RS frames. Then, the physical adaptation control signal handler 216 uses the collected FIC data and SI data to configure and process IP datagrams and access information of mobile broadcast services. Thereafter, the physical adaptation control signal handler 216 stores the processed IP datagrams and access information to the storage unit 290.

The primary RS frame handler 211 identifies primary RS frames received from the primary RS frame decoder 170 of the baseband processor 100 for each row unit, so as to configure an MH TP. Thereafter, the primary RS frame handler 211 outputs the configured MH TP to the MH TP handler 213.

The secondary RS frame handler 212 identifies secondary RS frames received from the secondary RS frame decoder 180 of the baseband processor 100 for each row unit, so as to configure an MH TP. Thereafter, the secondary RS frame handler 212 outputs the configured MH TP to the MH TP handler 213.

The MH transport packet (TP) handler 213 extracts a header from each MH TP received from the primary RS frame handler 211 and the secondary RS frame handler 212, thereby determining the data included in the corresponding MH TP. Then, when the determined data correspond to SI data (i.e., SI data that are not encapsulated to IP datagrams), the corresponding data are outputted to the physical adaptation control signal handler 216. Alternatively, when the determined data correspond to an IP datagram, the corresponding data are outputted to the IP network stack 220.

The IP network stack 220 processes broadcast data that are being transmitted in the form of IP datagrams. More specifically, the IP network stack 220 processes data that are inputted via user datagram protocol (UDP), real-time transport protocol (RTP), real-time transport control protocol (RTCP), asynchronous layered coding/layered coding transport (ALC/LCT), file delivery over unidirectional transport (FLUTE), and so on. Herein, when the processed data correspond to streaming data, the corresponding data are outputted to the streaming handler 230. And, when the processed data correspond to data in a file format, the corresponding data are outputted to the file handler 250. Finally, when the processed data correspond to SI-associated data, the corresponding data are outputted to the SI handler 240.

The SI handler 240 receives and processes SI data having the form of IP datagrams, which are inputted to the IP network stack 220.

When the inputted data associated with SI correspond to MIME-type data, the inputted data are outputted to the MIME-type handler 260.

The MIME-type handler 260 receives the MIME-type SI data outputted from the SI handler 240 and processes the received MIME-type SI data.

The file handler 250 receives data from the IP network stack 220 in an object format in accordance with the ALC/LCT and FLUTE structures. The file handler 250 groups the received data to create a file format. Herein, when the corresponding file includes ESG, the file is outputted to the ESG handler 270. On the other hand, when the corresponding file includes data for other file-based services, the file is outputted to the presentation controller 330 of the presentation processor 300.

The ESG handler 270 processes the ESG data received from the file handler 250 and stores the processed ESG data to the storage unit 290. Alternatively, the ESG handler 270 may output the processed ESG data to the ESG decoder 280, thereby allowing the ESG data to be used by the ESG decoder 280.

The storage unit 290 stores the system information (SI) received from the physical adaptation control signal handler 210 and the ESG handler 270 therein. Thereafter, the storage unit 290 transmits the stored SI data to each block.

The ESG decoder 280 either recovers the ESG data and SI data stored in the storage unit 290 or recovers the ESG data transmitted from the ESG handler 270. Then, the ESG decoder 280 outputs the recovered data to the presentation controller 330 in a format that can be outputted to the user.

The streaming handler 230 receives data from the IP network stack 220, wherein the format of the received data are in accordance with RTP and/or RTCP structures. The streaming handler 230 extracts audio/video streams from the received data, which are then outputted to the audio/video (A/V) decoder 310 of the presentation processor 300. The audio/video decoder 310 then decodes each of the audio stream and video stream received from the streaming handler 230.

The display module 320 of the presentation processor 300 receives audio and video signals respectively decoded by the A/V decoder 310. Then, the display module 320 provides the received audio and video signals to the user through a speaker and/or a screen.

The presentation controller 330 corresponds to a controller managing modules that output data received by the receiving system to the user.

The channel service manager 340 manages an interface with the user, which enables the user to use channel-based broadcast services, such as channel map management, channel service connection, and so on.

The application manager 350 manages an interface with a user using ESG display or other application services that do not correspond to channel-based services.

Data Format Structure

Meanwhile, the data structure used in the mobile broadcasting technology according to the embodiment of the present invention may include a data group structure and an RS frame structure, which will now be described in detail.

Figure 2:
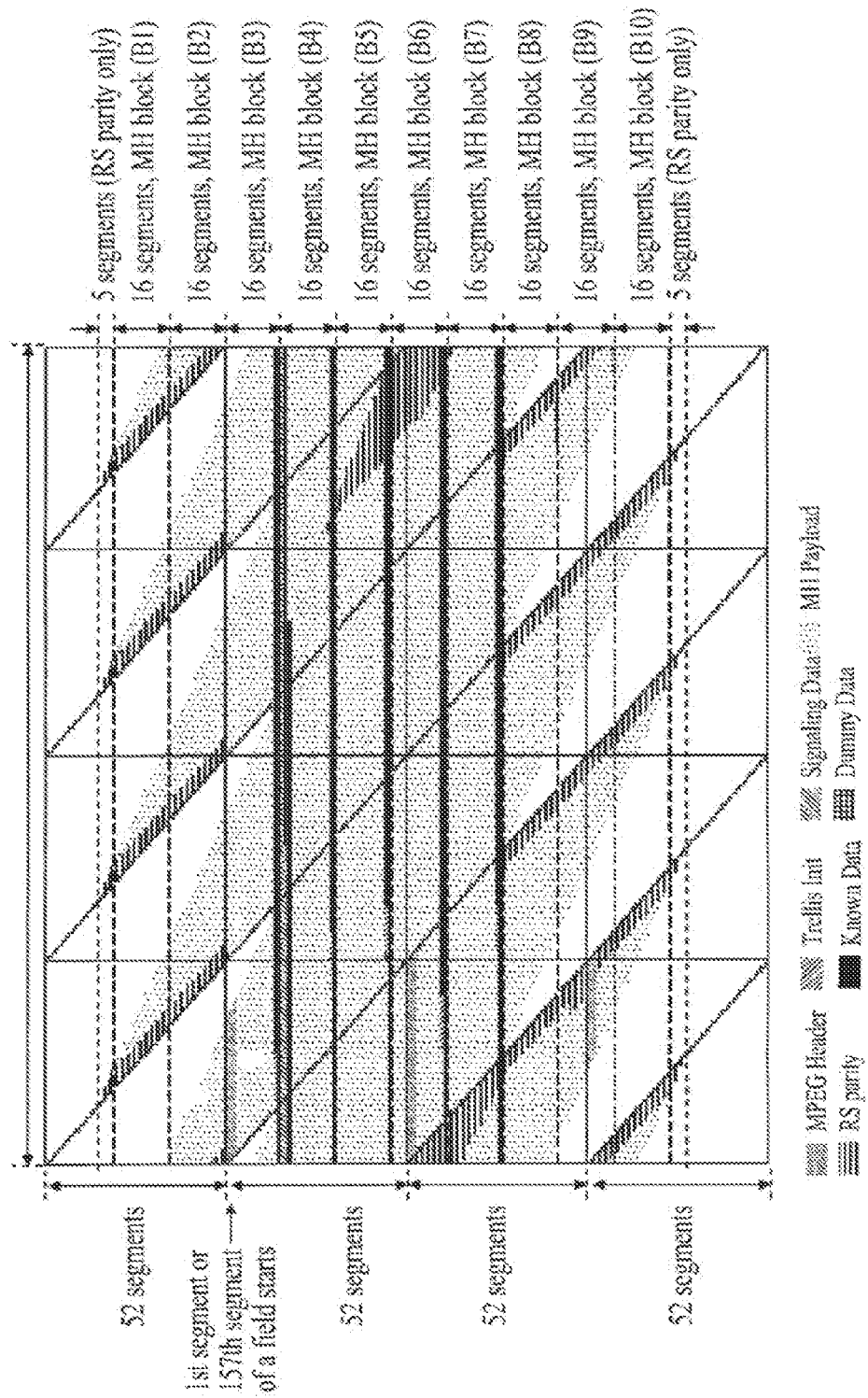
FIG. 2 illustrates an exemplary structure of a data group according to the present invention.

FIG. 2 illustrates an exemplary structure of a data group according to the present invention.

FIG. 2 shows an example of dividing a data group according to the data structure of the present invention into 10 MH blocks (i.e., MH block 1 (B1) to MH block 10 (B10)). In this example, each MH block has the length of 16 segments. Referring to FIG. 2, only the RS parity data are allocated to portions of the previous 5 segments of the MH block 1 (B1) and the next 5 segments of the MH block 10 (B10). The RS parity data are excluded in regions A to D of the data group.

More specifically, when it is assumed that one data group is divided into regions A, B, C, and D, each MH block may be included in any one of region A to region D depending upon the characteristic of each MH block within the data group. Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

Referring to FIG. 2, MH block 4 (B4) to MH block 7 (B7) correspond to regions without interference of the main service data. MH block 4 (B4) to MH block 7 (B7) within the data group shown in FIG. 2 correspond to a region where no interference from the main service data occurs. In this example, a long known data sequence is inserted at both the beginning and end of each MH block. In the description of the present invention, the region including MH block 4 (B4) to MH block 7 (B7) will be referred to as "region A (=B4+B5+B6+B7)". As described above, when the data group includes region A having a long known data sequence inserted at both the beginning and end of each MH block, the receiving system is capable of performing equalization by using the channel information that can be obtained from the known data. Therefore, the strongest equalizing performance may be yielded (or obtained) from one of region A to region D.

In the example of the data group shown in FIG. 2, MH block (B3) and MH block 8 (B8) correspond to a region having little interference from the main service data. Herein, a long known data sequence is inserted in only one side of each MH block B3 and B8. More specifically, due to the interference from the main service data, a long known data sequence is inserted at the end of MH block 3 (B3), and another long known data sequence is inserted at the beginning of MH block 8 (B8). In the present invention, the region including MH block 3 (B3) and MH block 8 (B8) will be referred to as "region B (=B3+B8)". As described above, when the data group includes region B having a long known data sequence inserted at only one side (beginning or end) of each MH block, the receiving system is capable of performing equalization by using the channel information that can be obtained from the known data. Therefore, a stronger equalizing performance as compared to region C/D may be yielded (or obtained).

Referring to FIG. 2, MH block 2 (B2) and MH block 9 (B9) correspond to a region having more interference from the main service data as compared to region B. A long known data sequence cannot be inserted in any side of MH block 2 (B2) and MH block 9 (B9). Herein, the region including MH block 2 (B2) and MH block 9 (B9) will be referred to as "region C (=B2+B9)".

Finally, in the example shown in FIG. 2, MH block 1 (B1) and MH block 10 (B10) correspond to a region having more interference from the main service data as compared to region C. Similarly, a long known data sequence cannot be inserted in any side of MH block 1 (B1) and MH block 10 (B10). Herein, the region including MH block 1 (B1) and MH block 10 (B10) will be referred to as "region D (=B1+B10)". Since region C/D is spaced further apart from the known data sequence, when the channel environment undergoes frequent and abrupt changes, the receiving performance of region C/D may be deteriorated.

Additionally, the data group includes a signaling information area wherein signaling information is assigned (or allocated).

In the present invention, the signaling information area may start from the $1^{st}$ segment of the $4^{th}$ MH block (B4) to a portion of the $2^{nd}$ segment. According to an embodiment of the present invention, the signaling information area for inserting signaling information may start from the $1^{st}$ segment of the $4^{th}$ MH block (B4) to a portion of the $2^{nd}$ segment.

More specifically, 276(=207+69) bytes of the $4^{th}$ MH block (B4) in each data group are assigned as the signaling information area. In other words, the signaling information area consists of 207 bytes of the $1^{st}$ segment and the first 69 bytes of the $2^{nd}$ segment of the $4^{th}$ MH block (B4). The $1^{st}$ segment of the $4^{th}$ MH block (B4) corresponds to the $17^{th}$ or $173^{rd}$ segment of a VSB field.

Herein, the signaling information may be identified by two different types of signaling channels: a transmission parameter channel (TPC) and a fast information channel (FIC).

Herein, the TPC data may include at least one of an MH ensemble ID, an MH sub-frame number, a total number of MH groups (TNoG), an RS frame continuity counter, a column size of RS frame (N), and an FIC version number. However, the TPC data (or information) presented herein are merely exemplary. And, since the adding or deleting of signaling information included in the TPC data may be easily adjusted and modified by one skilled in the art, the present invention will, therefore, not be limited to the examples set forth herein. Furthermore, the FIC is provided to enable a fast service acquisition of data receivers, and the FIC includes cross layer information between the physical layer and the upper layer(s).

For example, when the data group includes 6 known data sequences, as shown in FIG. 2, the signaling information area is located between the first known data sequence and the second known data sequence. More specifically, the first known data sequence is inserted in the last 2 segments of the 3rd MH block (B3), and the second known data sequence in inserted in the $2^{nd}$ and $3^{rd}$ segments of the $4^{th}$ MH block (B4). Furthermore, the $3^{rd}$ to $6^{th}$ known data sequences are respectively inserted in the last 2 segments of each of the $4^{th}$, $5^{th}$, $6^{th}$, and $7^{th}$ MH blocks (B4, B5, B6, and B7). The $1^{st}$ and $3^{rd}$ to $6^{th}$ known data sequences are spaced apart by 16 segments.

Figure 3:
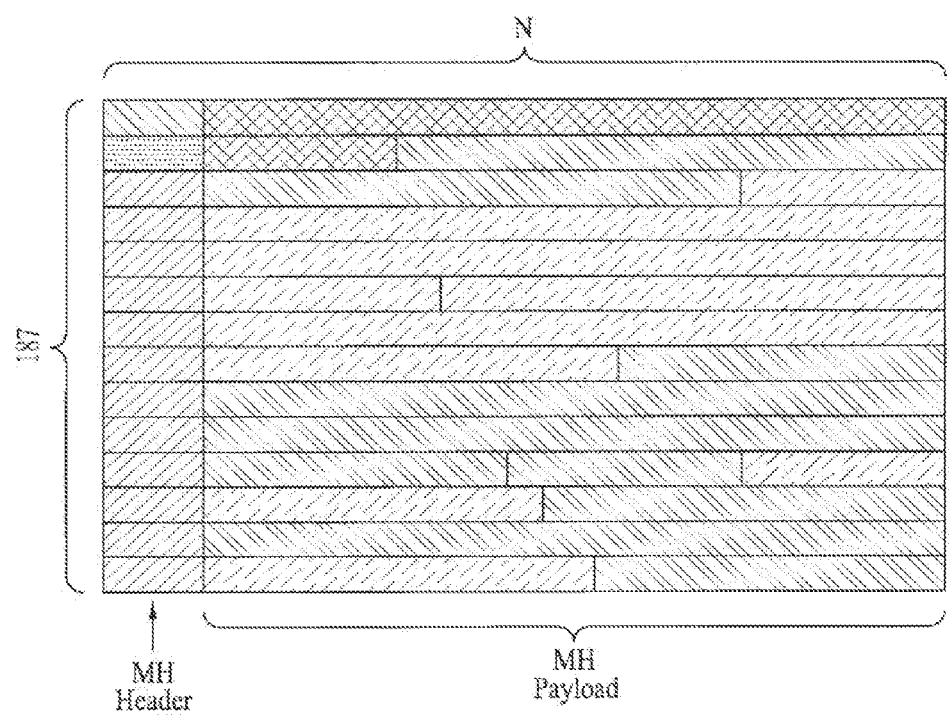
FIG. 3 illustrates an RS frame according to an embodiment of the present invention.

FIG. 3 illustrates an RS frame according to an embodiment of the present invention.

The RS frame shown in FIG. 3 corresponds to a collection of one or more data groups. The RS frame is received for each MH frame in a condition where the receiving system receives the FIC and processes the received FIC and where the receiving system is switched to a time-slicing mode so that the receiving system can receive MH ensembles including ESG entry points. Each RS frame includes IP streams of each service or ESG, and SMT section data may exist in all RS frames.

The RS frame according to the embodiment of the present invention consists of at least one MH transport packet (TP). Herein, the MH TP includes an MH header and an MH payload.

The MH payload may include mobile service data as well as signaling data. More specifically, an MH payload may include only mobile service data, or may include only signaling data, or may include both mobile service data and signaling data.

According to the embodiment of the present invention, the MH header may identify (or distinguish) the data types included in the MH payload. More specifically, when the MH TP includes a first MH header, this indicates that the MH payload includes only the signaling data. Also, when the MH TP includes a second MH header, this indicates that the MH payload includes both the signaling data and the mobile service data. Finally, when MH TP includes a third MH header, this indicates that the MH payload includes only the mobile service data.

In the example shown in FIG. 3, the RS frame is assigned with IP datagrams (IP datagram 1 and IP datagram 2) for two service types.

Data Transmission Structure

Figure 4:
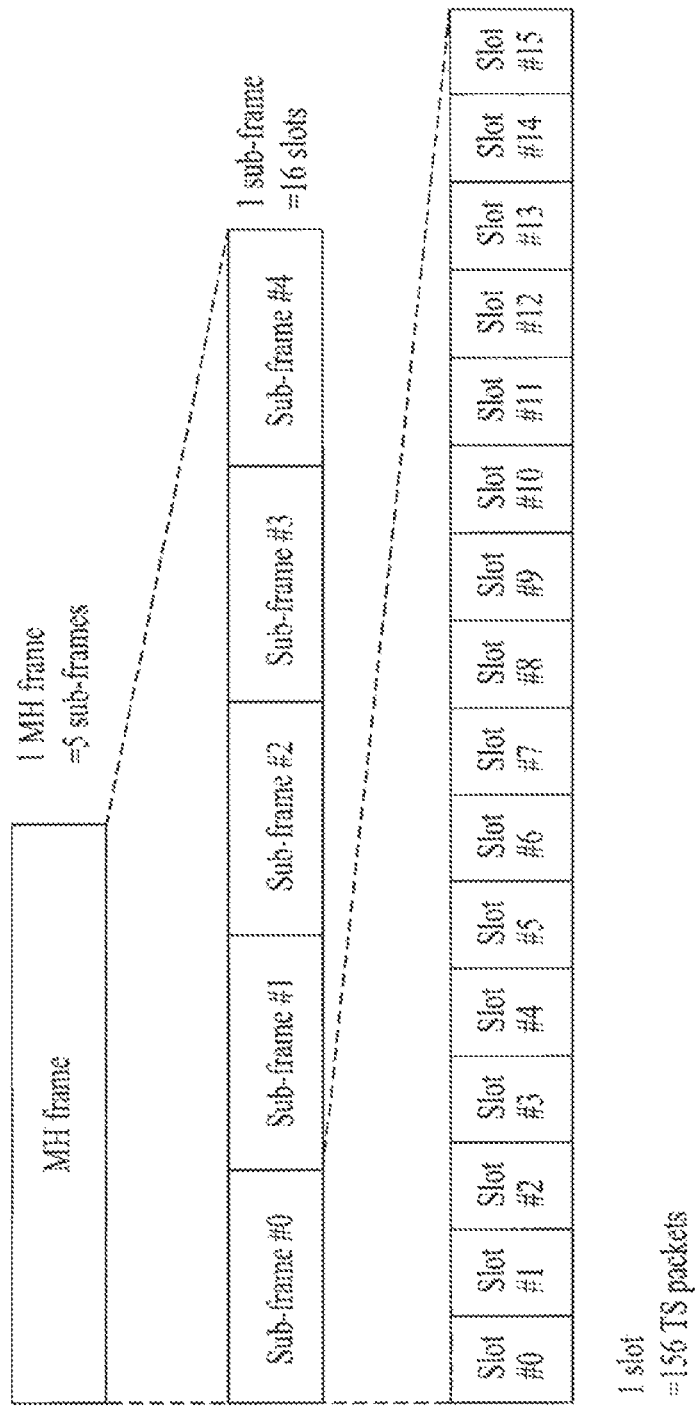
FIG. 4 illustrates an example of an MH frame structure for transmitting and receiving mobile service data according to the present invention.

FIG. 4 illustrates a structure of a MH frame for transmitting and receiving mobile service data according to the present invention. In the example shown in FIG. 4, one MH frame consists of 5 sub-frames, wherein each sub-frame includes 16 slots. In this case, the MH frame according to the present invention includes 5 sub-frames and 80 slots.

Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of data as a data segment, a data packet prior to being interleaved may also be used as a data segment. At this point, two VSB fields are grouped to form a VSB frame.

Figure 5:
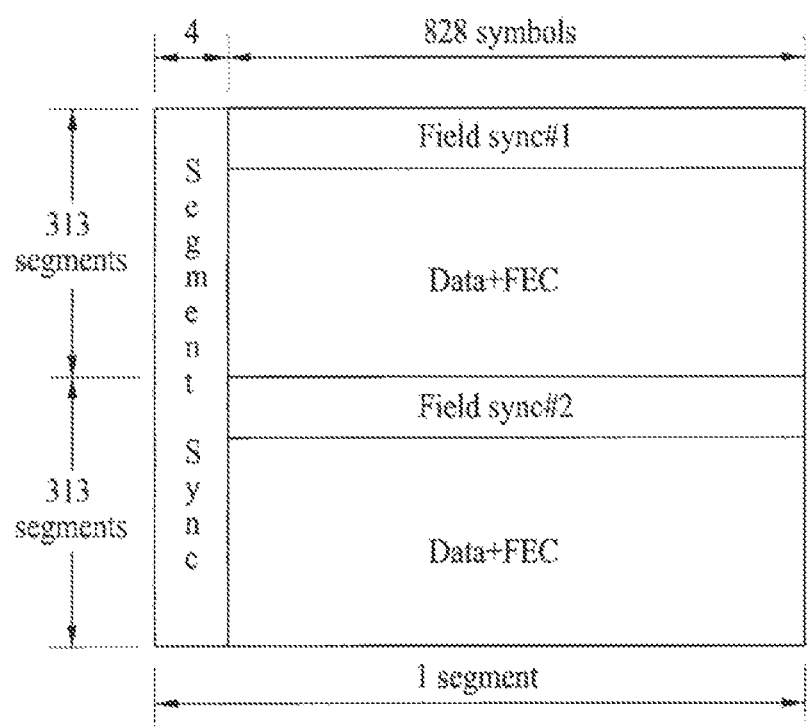
FIG. 5 illustrates an example of a general VSB frame structure.

FIG. 5 illustrates an exemplary structure of a VSB frame, wherein one VSB frame consists of 2 VSB fields (i.e., an odd field and an even field). Herein, each VSB field includes a field synchronization segment and 312 data segments.

The slot corresponds to a basic time unit for multiplexing the mobile service data and the main service data. Herein, one slot may either include the mobile service data or be configured only of the main service data.

If the first 118 data packets within the slot correspond to a data group, the remaining 38 data packets become the main service data packets. In another example, when no data group exists in a slot, the corresponding slot is configured of 156 main service data packets.

Meanwhile, when the slots are assigned to a VSB frame, an off-set exists for each assigned position.

Figure 6:
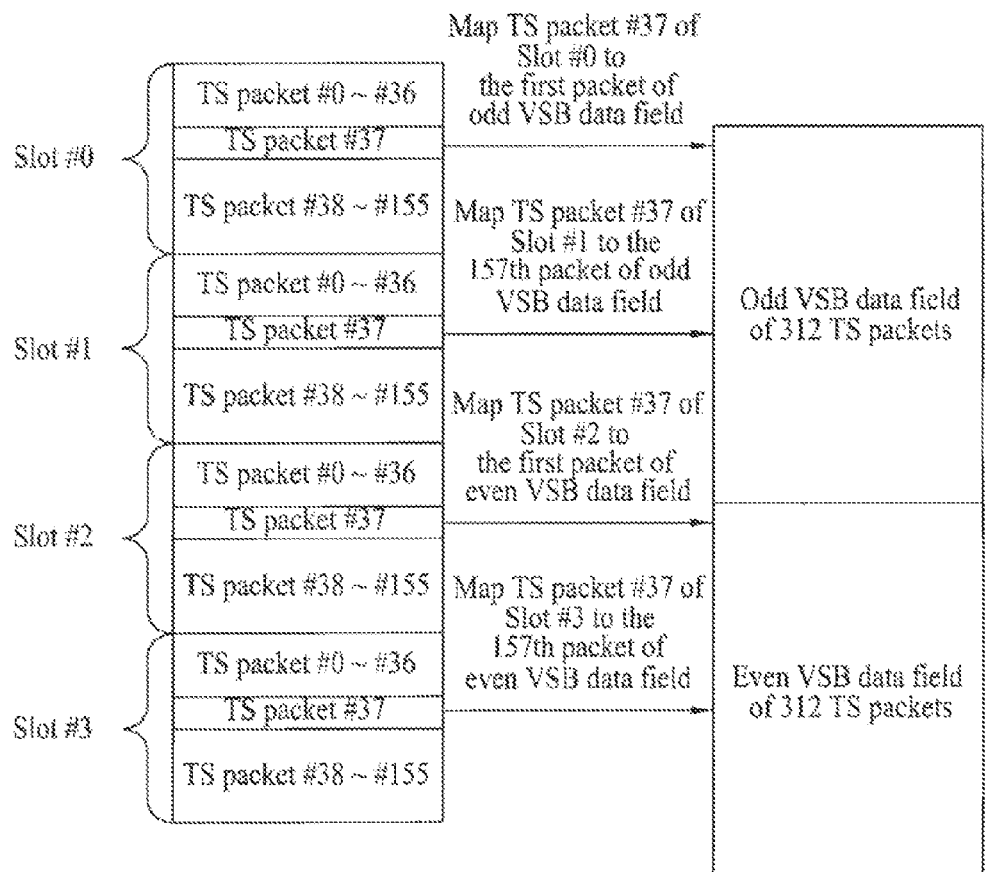
FIG. 6 illustrates a example of mapping positions of the first 4 slots of a sub-frame in a spatial area with respect to a VSB frame.

FIG. 6 illustrates a mapping example of the positions to which the first 4 slots of a sub-frame are assigned with respect to a VSB frame in a spatial area. And, FIG. 7 illustrates a mapping example of the positions to which the first 4 slots of a sub-frame are assigned with respect to a VSB frame in a chronological (or time) area.

Figure 7:
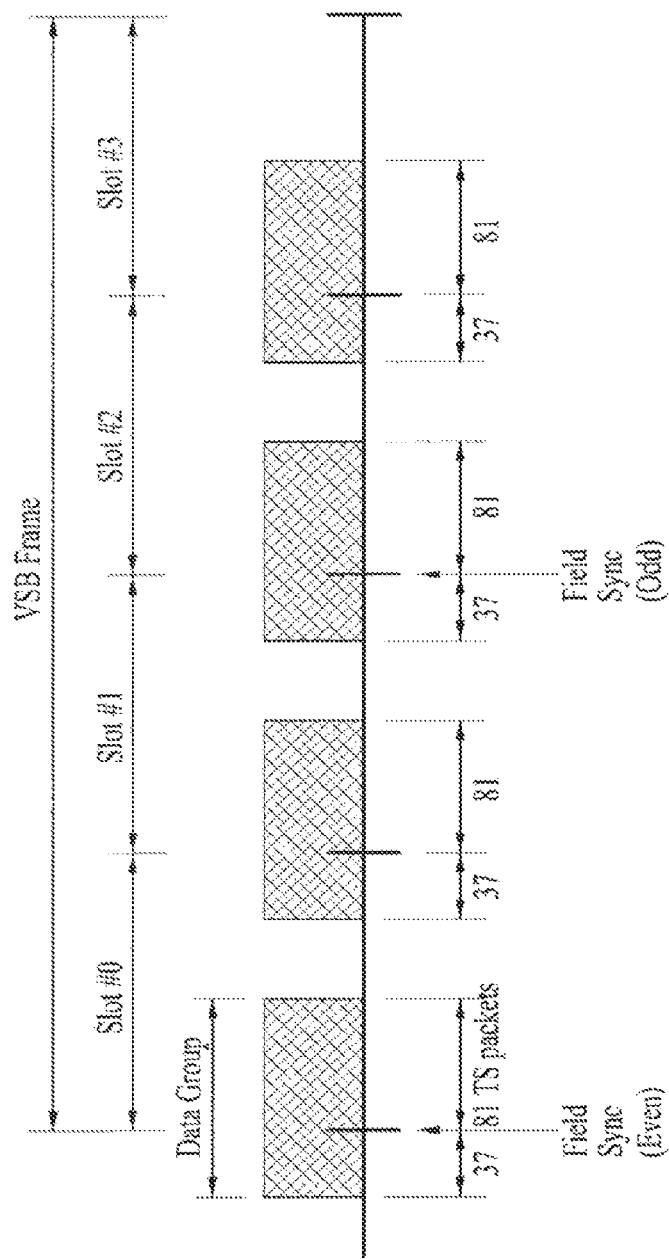
FIG. 7 illustrates a example of mapping positions of the first 4 slots of a sub-frame in a chronological (or time) area with respect to a VSB frame.

Referring to FIG. 6 and FIG. 7, a $38^{th}$ data packet (TS packet #37) of a $1^{st}$ slot (Slot #0) is mapped to the $1^{st}$ data packet of an odd VSB field. A $38^{th}$ data packet (TS packet #37) of a $2^{nd}$ slot (Slot #1) is mapped to the $157^{th}$ data packet of an odd VSB field. Also, a $38^{th}$ data packet (TS packet #37) of a $3^{rd}$ slot (Slot #2) is mapped to the $1^{st}$ data packet of an even VSB field. And, a $38^{th}$ data packet (TS packet #37) of a $4^{th}$ slot (Slot #3) is mapped to the $157^{th}$ data packet of an even VSB field. Similarly, the remaining 12 slots within the corresponding sub-frame are mapped in the subsequent VSB frames using the same method.

Figure 8:
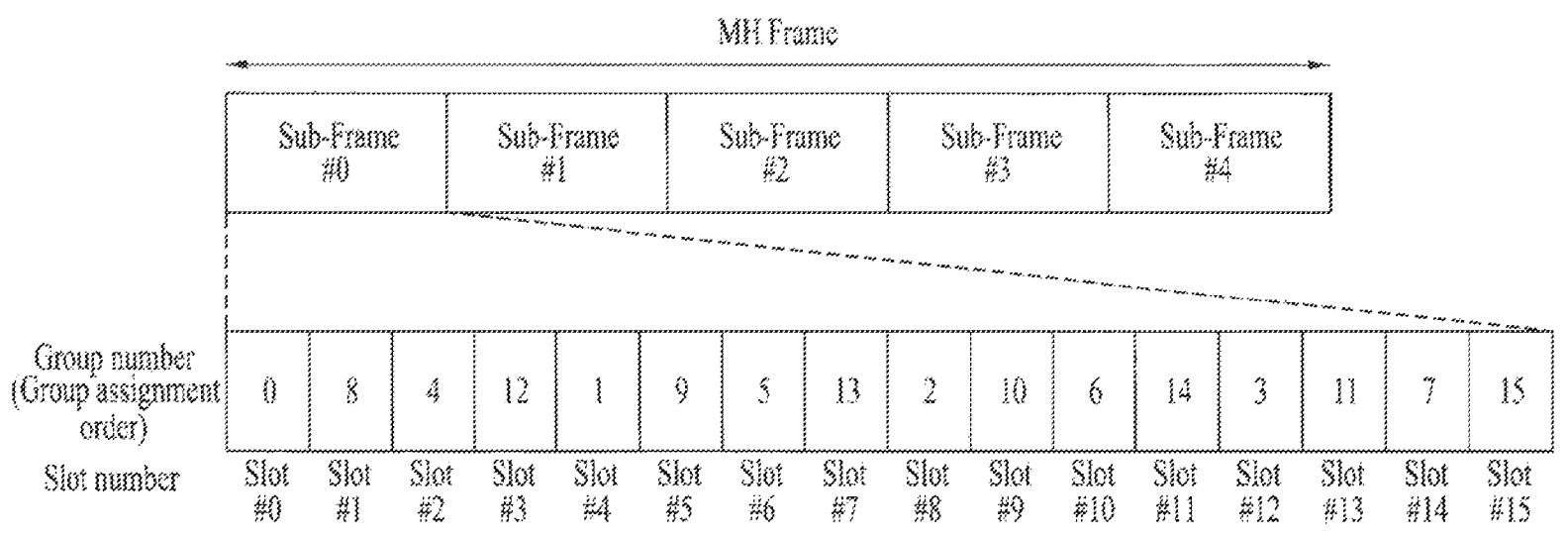

FIG. 8 illustrates an exemplary assignment order of data groups being assigned to one of 5 sub-frames, wherein the 5 sub-frames configure an MH frame. For example, the method of assigning data groups may be identically applied to all MH frames or differently applied to each MH frame. Furthermore, the method of assigning data groups may be identically applied to all sub-frames or differently applied to each sub-frame. At this point, when it is assumed that the data groups are assigned using the same method in all sub-frames of the corresponding MH frame, the total number of data groups being assigned to an MH frame is equal to a multiple of '5'.

According to the embodiment of the present invention, a plurality of consecutive data groups is assigned to be spaced as far apart from one another as possible within the sub-frame. Thus, the system can be capable of responding promptly and effectively to any burst error that may occur within a sub-frame.

For example, when it is assumed that 3 data groups are assigned to a sub-frame, the data groups are assigned to a $1^{st}$ slot (Slot #0), a $5^{th}$ slot (Slot #4), and a $9^{th}$ slot (Slot #8) in the sub-frame, respectively. FIG. 8 illustrates an example of assigning 16 data groups in one sub-frame using the above-described pattern (or rule). In other words, each data group is serially assigned to 16 slots corresponding to the following numbers: 0, 8, 4, 12, 1, 9, 5, 13, 2, 10, 6, 14, 3, 11, 7, and 15. Equation 1 below shows the above-described rule (or pattern) for assigning data groups in a sub-frame.

$$j = (4i+0) \bmod 16 \qquad \text{Equation 1}$$

0=0 if i<4,

0=2 else if i<8,

Herein,

0=1 else if i<12,

0=3 else.

Herein, j indicates the slot number within a sub-frame.

The value of j may range from 0 to 15 (i.e., 0≤j≤15). Also, variable i indicates the data group number. The value of i may range from 0 to 15 (i.e., 0≤i≤15).

In the present invention, a collection of data groups included in a MH frame will be referred to as a "parade". Based upon the RS frame mode, the parade transmits data of at least one specific RS frame.

The mobile service data within one RS frame may be assigned either to all of regions A/B/C/D within the corresponding data group, or to at least one of regions A/B/C/D. In the embodiment of the present invention, the mobile service data within one RS frame may be assigned either to all of regions A/B/C/D, or to at least one of regions A/B and regions C/D. If the mobile service data are assigned to the latter case (i.e., one of regions A/B and regions C/D), the RS frame being assigned to regions A/B and the RS frame being assigned to regions C/D within the corresponding data group are different from one another. According to the embodiment of the present invention, the RS frame being assigned to regions A/B within the corresponding data group will be referred to as a "primary RS frame", and the RS frame being assigned to regions C/D within the corresponding data group will be referred to as a "secondary RS frame", for simplicity. Also, the primary RS frame and the secondary RS frame form (or configure) one parade. More specifically, when the mobile service data within one RS frame are assigned either to all of regions A/B/C/D within the corresponding data group, one parade transmits one RS frame. Conversely, when the mobile service data within one RS frame are assigned either to at least one of regions A/B and regions C/D, one parade may transmit up to 2 RS frames.

More specifically, the RS frame mode indicates whether a parade transmits one RS frame, or whether the parade transmits two RS frames. Such RS frame mode is transmitted as the above-described TPC data.

Table 1 below shows an example of the RS frame mode.

TABLE 1

| RS frame mode (2 bits) | Description |
| --- | --- |
| 00 | There is only one primary RS frame for all group regions |
| 01 | There are two separate RS frames. Primary RS frame for group regions A and B Secondary RS frame for group regions C and D |
| 10 | Reserved |
| 11 | Reserved |

Table 1 illustrates an example of allocating 2 bits in order to indicate the RS frame mode. For example, referring to Table 1, when the RS frame mode value is equal to '00', this indicates that one parade transmits one RS frame. And, when the RS frame mode value is equal to '01', this indicates that one parade transmits two RS frames, i.e., the primary RS frame and the secondary RS frame. More specifically, when the RS frame mode value is equal to '01', data of the primary RS frame for regions A/B are assigned and transmitted to regions A/B of the corresponding data group. Similarly, data of the secondary RS frame for regions C/D are assigned and transmitted to regions C/D of the corresponding data group.

As described in the assignment of data groups, the parades are also assigned to be spaced as far apart from one another as possible within the sub-frame. Thus, the system can be capable of responding promptly and effectively to any burst error that may occur within a sub-frame.

Furthermore, the method of assigning parades may be identically applied to all MH frames or differently applied to each MH frame. According to the embodiment of the present invention, the parades may be assigned differently for each MH frame and identically for all sub-frames within an MH frame. More specifically, the MH frame structure may vary by MH frame units. Thus, an ensemble rate may be adjusted on a more frequent and flexible basis.

Figure 9:
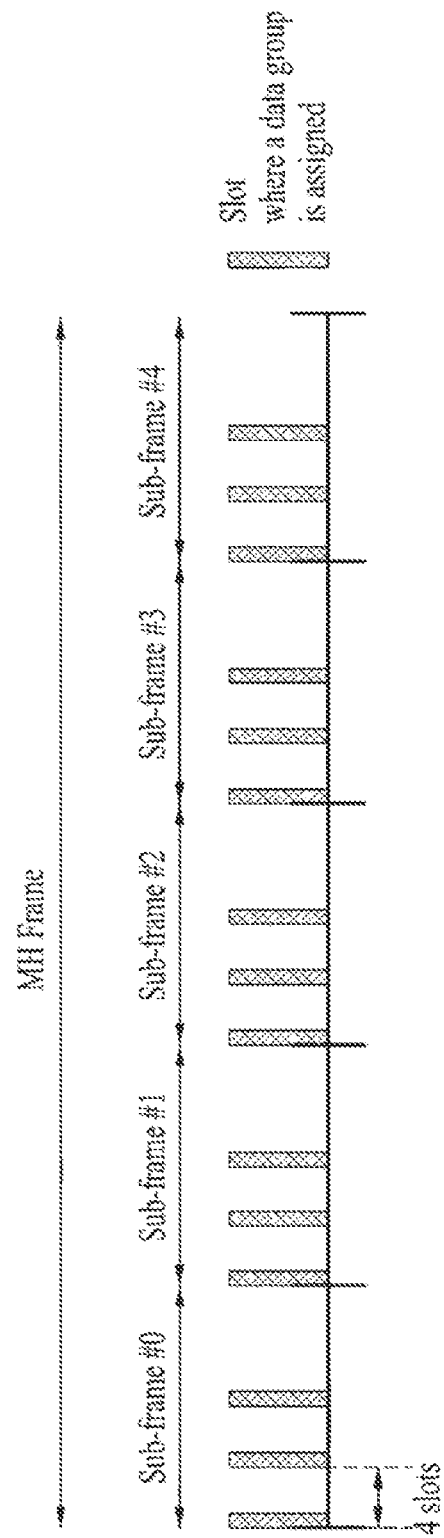
FIG. 9 illustrates an example of a single parade being assigned to an MH frame according to the present invention.

FIG. 9 illustrates an example of multiple data groups of a single parade being assigned (or allocated) to an MH frame. More specifically, FIG. 9 illustrates an example of a plurality of data groups included in a single parade, wherein the number of data groups included in a sub-frame is equal to '3', being allocated to an MH frame.

Referring to FIG. 9, 3 data groups are sequentially assigned to a sub-frame at a cycle period of 4 slots. Accordingly, when this process is equally performed in the 5 sub-frames included in the corresponding MH frame, 15 data groups are assigned to a single MH frame. Herein, the 15 data groups correspond to data groups included in a parade. Therefore, since one sub-frame is configured of 4 VSB frame, and since 3 data groups are included in a sub-frame, the data group of the corresponding parade is not assigned to one of the 4 VSB frames within a sub-frame.

For example, when it is assumed that one parade transmits one RS frame, and that a RS frame encoder (not shown) included in the transmitting system performs RS-encoding on the corresponding RS frame, thereby adding 24 bytes of parity data to the corresponding RS frame and transmitting the processed RS frame, the parity data occupy approximately 11.37% (=24/(187+24)×100) of the total code word length. Meanwhile, when one sub-frame includes 3 data groups, and when the data groups included in the parade are assigned, as shown in FIG. 9, a total of 15 data groups form an RS frame. Accordingly, even when an error occurs in an entire data group due to a burst noise within a channel, the percentile is merely 6.67% (=1/15×100). Therefore, the receiving system may correct all errors by performing an erasure RS decoding process. More specifically, when the erasure RS decoding is performed, a number of channel errors corresponding to the number of RS parity bytes may be corrected. By doing so, the receiving system may correct the error of at least one data group within one parade. Thus, the minimum burst noise length correctable by a RS frame is over 1 VSB frame.

Meanwhile, when data groups of a parade are assigned as shown in FIG. 9, either main service data may be assigned between each data group, or data groups corresponding to different parades may be assigned between each data group. More specifically, data groups corresponding to multiple parades may be assigned to one MH frame.

Basically, the method of assigning data groups corresponding to multiple parades is very similar to the method of assigning data groups corresponding to a single parade. In other words, data groups included in other parades that are to be assigned to an MH frame are also respectively assigned according to a cycle period of 4 slots.

At this point, data groups of a different parade may be sequentially assigned to the respective slots in a circular method. Herein, the data groups are assigned to slots starting from the ones to which data groups of the previous parade have not yet been assigned.

For example, when it is assumed that data groups corresponding to a parade are assigned as shown in FIG. 9, data groups corresponding to the next parade may be assigned to a sub-frame starting either from the 12$^{th}$ slot of a sub-frame. However, this is merely exemplary. In another example, the data groups of the next parade may also be sequentially assigned to a different slot within a sub-frame at a cycle period of 4 slots starting from the 3$^{rd}$ slot.

Figure 10:
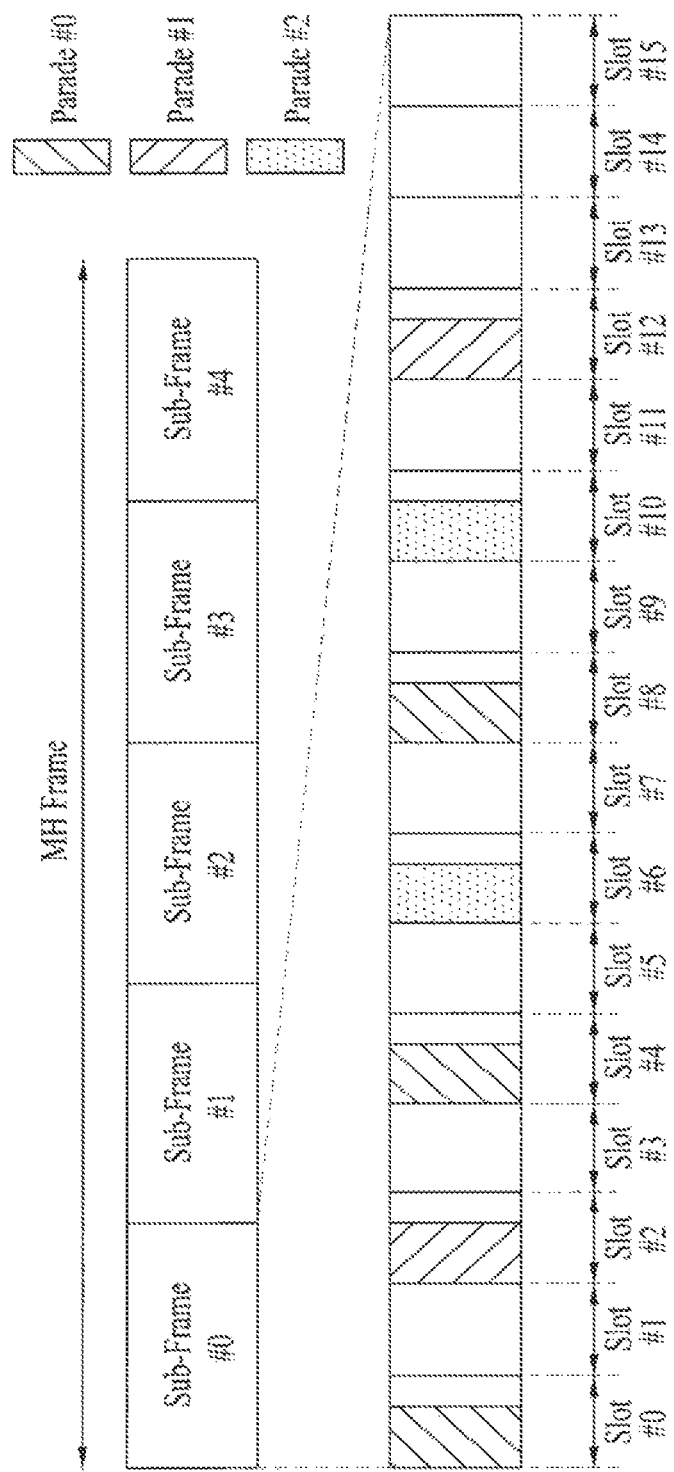
FIG. 10 illustrates an example of 3 parades being assigned to an MH frame according to the present invention.

FIG. 10 illustrates an example of transmitting 3 parades (Parade #0, Parade #1, and Parade #2) to an MH frame. More specifically, FIG. 10 illustrates an example of transmitting parades included in one of 5 sub-frames, wherein the 5 sub-frames configure one MH frame.

When the 1$^{st}$ parade (Parade #0) includes 3 data groups for each sub-frame, the positions of each data groups within the sub-frames may be obtained by substituting values '0' to '2' for i in Equation 1. More specifically, the data groups of the 1$^{st}$ parade (Parade #0) are sequentially assigned to the 1$^{st}$, 5$^{th}$, and 9$^{th}$ slots (Slot #0, Slot #4, and Slot #8) within the sub-frame.

Also, when the 2$^{nd}$ parade includes 2 data groups for each sub-frame, the positions of each data groups within the sub-frames may be obtained by substituting values '3' and '4' for i in Equation 1. More specifically, the data groups of the 2nd parade (Parade #1) are sequentially assigned to the 2$^{nd}$ and 12$^{th}$ slots (Slot #1 and Slot #11) within the sub-frame.

Finally, when the 3$^{rd}$ parade includes 2 data groups for each sub-frame, the positions of each data groups within the sub-frames may be obtained by substituting values '5' and '6' for i in Equation 1. More specifically, the data groups of the 3$^{rd}$ parade (Parade #2) are sequentially assigned to the 7$^{th}$ and 11$^{th}$ slots (Slot #6 and Slot #10) within the sub-frame.

As described above, data groups of multiple parades may be assigned to a single MH frame, and, in each sub-frame, the data groups are serially allocated to a group space having 4 slots from left to right.

Therefore, a number of groups of one parade per sub-frame (NoG) may correspond to any one integer from '1' to '8'. Herein, since one MH frame includes 5 sub-frames, the total number of data groups within a parade that can be allocated to an MH frame may correspond to any one multiple of '5' ranging from '5' to '40'.

Figure 11:
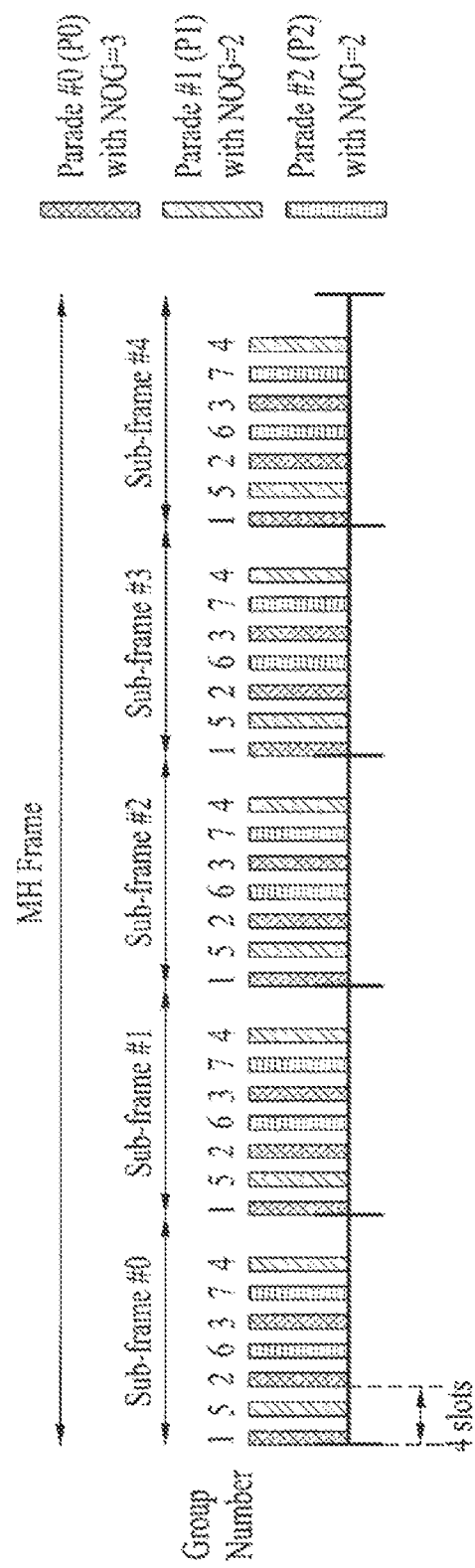
FIG. 11 illustrates an example of the process of assigning 3 parades shown in FIG. 10 being expanded to 5 sub-frames within an MH frame.

FIG. 11 illustrates an example of expanding the assignment process of 3 parades, shown in FIG. 10, to 5 sub-frames within an MH frame.

Figure 12:
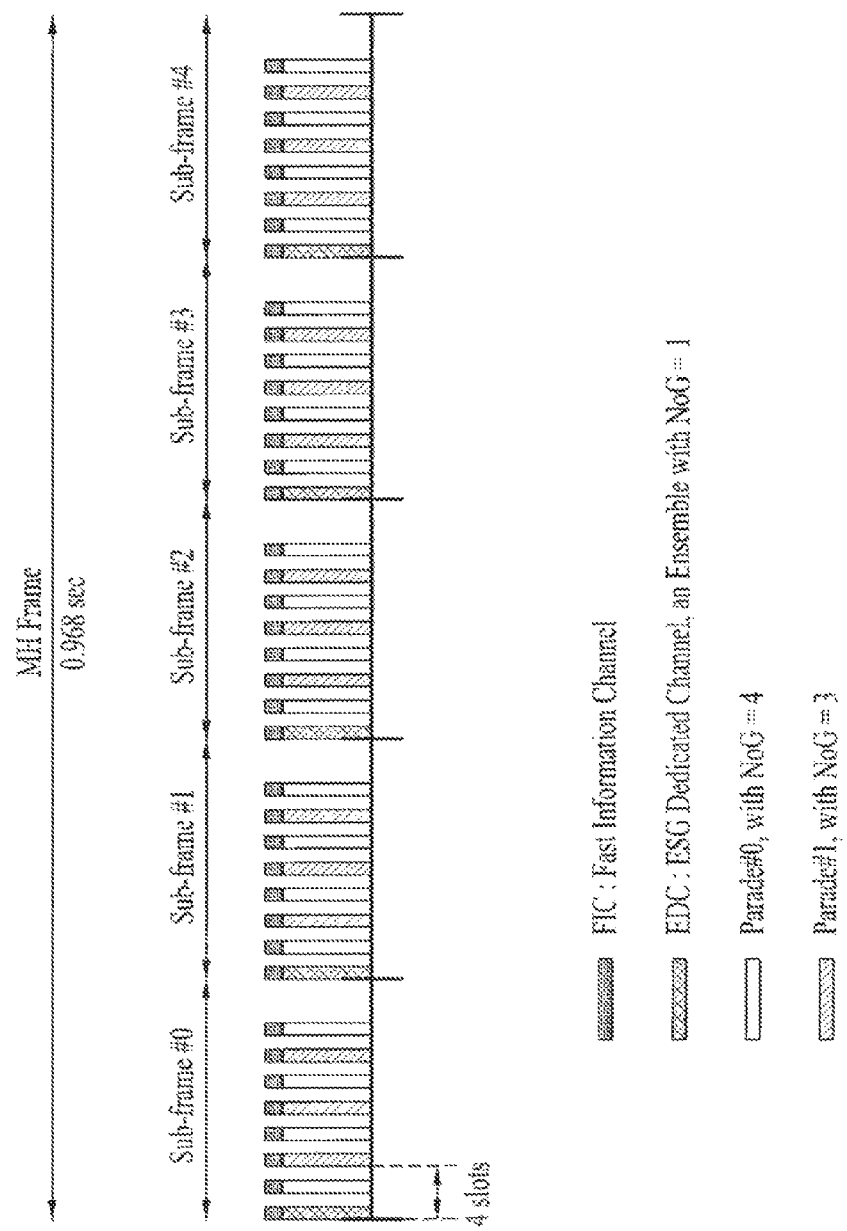
FIG. 12 illustrates a data transmission structure according to an embodiment of the present invention, wherein signaling data are included in a data group so as to be transmitted.

FIG. 12 illustrates a data transmission structure according to an embodiment of the present invention, wherein signaling data are included in a data group so as to be transmitted.

As described above, an MH frame is divided into 5 sub-frames. Data groups corresponding to a plurality of parades co-exist in each sub-frame. Herein, the data groups corresponding to each parade are grouped by MH frame units, thereby configuring a single parade.

The data structure shown in FIG. 12 includes 3 parades, one ESG dedicated channel (EDC) parade (i.e., parade with NoG=1), and 2 service parades (i.e., parade with NoG=4 and parade with NoG=3). Also, a predetermined portion of each data group (i.e., 37 bytes/data group) is used for delivering (or sending) FIC information associated with mobile service data, wherein the FIC information is separately encoded from the RS-encoding process. The FIC region assigned to each data group consists of one FIC segments. Herein, each segment is interleaved by MH sub-frame units, thereby configuring an FIC body, which corresponds to a completed FIC transmission structure. However, whenever required, each segment may be interleaved by MH frame units and not by MH sub-frame units, thereby being completed in MH frame units.

Meanwhile, the concept of an MH ensemble is applied in the embodiment of the present invention, thereby defining a collection (or group) of services. Each MH ensemble carries the same QoS and is coded with the same FEC code. Also, each MH ensemble has the same unique identifier (i.e., ensemble ID) and corresponds to consecutive RS frames.

As shown in FIG. 12, the FIC segment corresponding to each data group described service information of an MH ensemble to which the corresponding data group belongs. When FIC segments within a sub-frame are grouped and deinterleaved, all service information of a physical channel through which the corresponding FICs are transmitted may be obtained. Therefore, the receiving system may be able to acquire the channel information of the corresponding physical channel, after being processed with physical channel tuning, during a sub-frame period.

Furthermore, FIG. 12 illustrates a structure further including a separate EDC parade apart from the service parade and wherein electronic service guide (ESG) data are transmitted in the 1$^{st}$ slot of each sub-frame.

Hierarchical Signaling Structure

Figure 13:
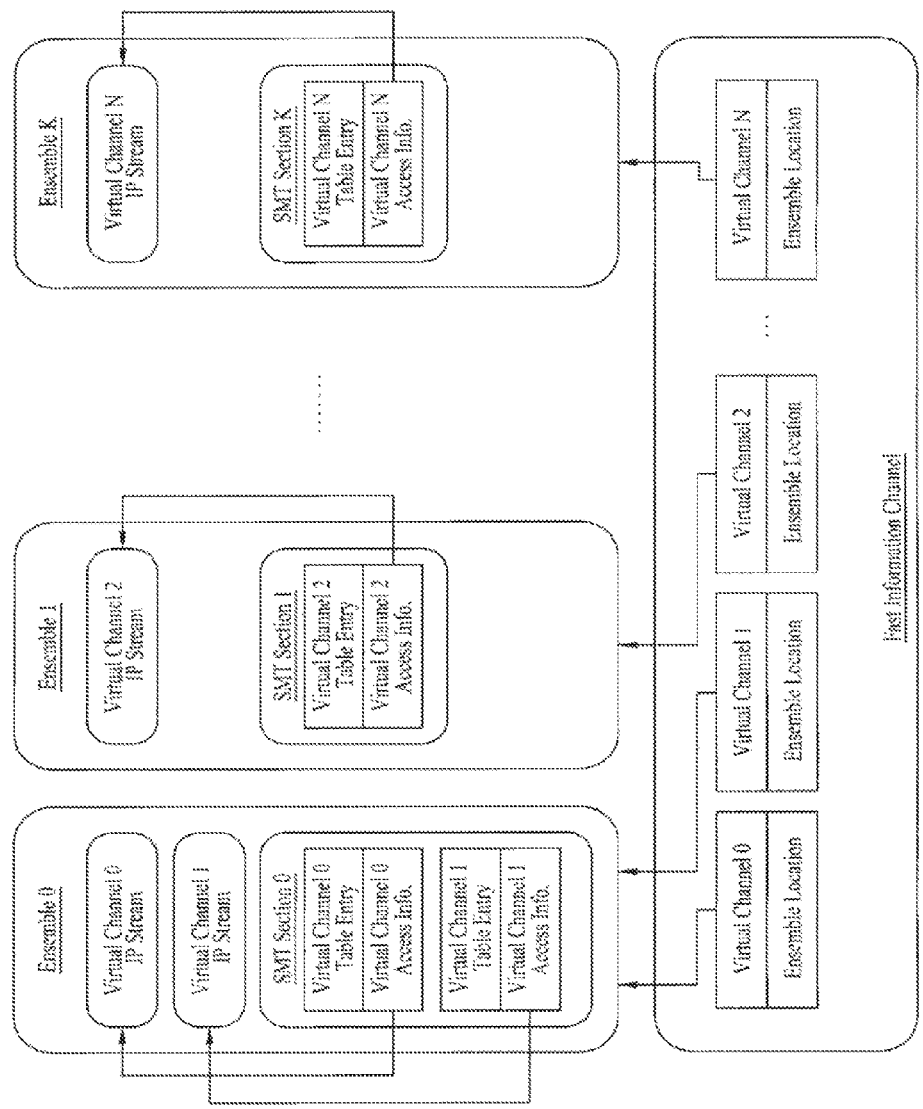
FIG. 13 illustrates a hierarchical signaling structure according to an embodiment of the present invention.

FIG. 13 illustrates a hierarchical signaling structure according to an embodiment of the present invention. As shown in FIG. 13, the mobile broadcasting technology according to the embodiment of the present invention adopts a signaling method using FIC and SMT. In the description of the present invention, the signaling structure will be referred to as a hierarchical signaling structure.

Hereinafter, a detailed description on how the receiving system accesses a virtual channel via FIC and SMT will now be given with reference to FIG. 13.

The FIC body defined in an MH transport (M1) identifies the physical location of each the data stream for each virtual channel and provides very high level descriptions of each virtual channel.

Being MH ensemble level signaling information, the service map table (SMT) provides MH ensemble level signaling information. The SMT provides the IP access information of each virtual channel belonging to the respective MH ensemble within which the SMT is carried. The SMT also provides all IP stream component level information required for the virtual channel service acquisition.

Referring to FIG. 13, each MH ensemble (i.e., Ensemble 0, Ensemble 1, . . . , Ensemble K) includes a stream information on each associated (or corresponding) virtual channel (e.g., virtual channel 0 IP stream, virtual channel 1 IP stream, and virtual channel 2 IP stream). For example, Ensemble 0 includes virtual channel 0 IP stream and virtual channel 1 IP stream. And, each MH ensemble includes diverse information on the associated virtual channel (i.e., Virtual Channel 0 Table Entry, Virtual Channel 0 Access Info, Virtual Channel 1 Table Entry, Virtual Channel 1 Access Info, Virtual Channel 2 Table Entry, Virtual Channel 2 Access Info, Virtual Channel N Table Entry, Virtual Channel N Access Info, and so on).

The FIC body payload includes information on MH ensembles (e.g., ensemble_id field, and referred to as "ensemble location" in FIG. 13) and information on a virtual channel associated with the corresponding MH ensemble (e.g., when such information corresponds to a major_channel_num field and a minor_channel_num field, the information is expressed as Virtual Channel 0, Virtual Channel 1, . . . , Virtual Channel N in FIG. 13).

The application of the signaling structure in the receiving system will now be described in detail.

When a user selects a channel he or she wishes to view (hereinafter, the user-selected channel will be referred to as "channel θ" for simplicity), the receiving system first parses the received FIC. Then, the receiving system acquires information on an MH ensemble (i.e., ensemble location), which is associated with the virtual channel corresponding to channel θ (hereinafter, the corresponding MH ensemble will be referred to as "MH ensemble θ" for simplicity). By acquiring slots only corresponding to the MH ensemble θ using the time-slicing method, the receiving system configures ensemble θ. The ensemble θ configured as described above, includes an SMT on the associated virtual channels (including channel θ) and IP streams on the corresponding virtual channels. Therefore, the receiving system uses the SMT included in the MH ensemble θ in order to acquire various information on channel θ (e.g., Virtual Channel θ Table Entry) and stream access information on channel θ (e.g., Virtual Channel θ Access Info). The receiving system uses the stream access information on channel θ to receive only the associated IP streams, thereby providing channel θ services to the user.

Fast Information Channel (FIC)

The digital broadcast receiving system according to the present invention adopts the fast information channel (FIC) for a faster access to a service that is currently being broadcasted.

More specifically, the FIC handler 215 of FIG. 1 parses the FIC body, which corresponds to an FIC transmission structure, and outputs the parsed result to the physical adaptation control signal handler 216.

Figure 14:
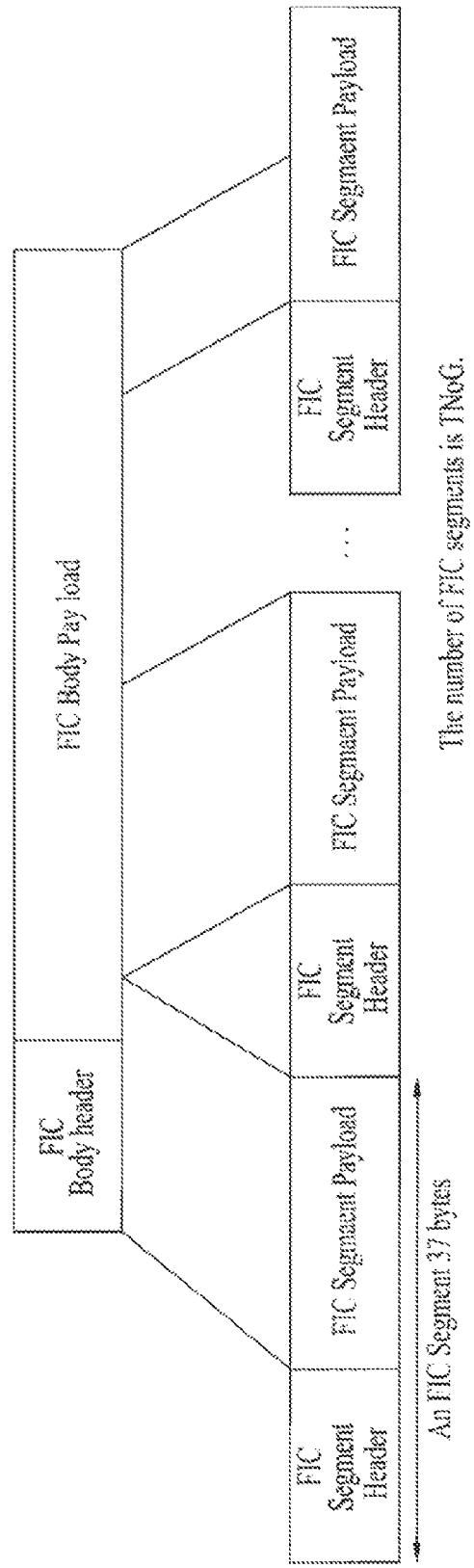
FIG. 14 illustrates an exemplary FIC body format according to an embodiment of the present invention.

FIG. 14 illustrates an exemplary FIC body format according to an embodiment of the present invention. According to the embodiment of the present invention, the FIC format consists of an FIC body header and an FIC body payload.

Meanwhile, according to the embodiment of the present invention, data are transmitted through the FIC body header and the FIC body payload in FIC segment units. Each FIC segment has the size of 37 bytes, and each FIC segment consists of a 2-byte FIC segment header and a 35-byte FIC segment payload. More specifically, an FIC body configured of an FIC body header and an FIC body payload, is segmented in units of 35 data bytes, which are then carried in at least one FIC segment within the FIC segment payload, so as to be transmitted.

In the description of the present invention, an example of inserting one FIC segment in one data group, which is then transmitted, will be given. In this case, the receiving system receives a slot corresponding to each data group by using a time-slicing method.

The signaling decoder 190 included in the receiving system shown in FIG. 1 collects each FIC segment inserted in each data group. Then, the signaling decoder 190 uses the collected FIC segments to created a single FIC body. Thereafter, the signaling decoder 190 performs a decoding process on the FIC body payload of the created FIC body, so that the decoded FIC body payload corresponds to an encoded result of a signaling encoder (not shown) included in the transmitting system. Subsequently, the decoded FIC body payload is outputted to the FIC handler 215. The FIC handler 215 parses the FIC data included in the FIC body payload, and then outputs the parsed FIC data to the physical adaptation control signal handler 216. The physical adaptation control signal handler 216 uses the inputted FIC data to perform processes associated with MH ensembles, virtual channels, SMTs, and so on.

According to an embodiment of the present invention, when an FIC body is segmented, and when the size of the last segmented portion is smaller than 35 data bytes, it is assumed that the lacking number of data bytes in the FIC segment payload is completed with by adding the same number of stuffing bytes therein, so that the size of the last FIC segment can be equal to 35 data bytes.

However, it is apparent that the above-described data byte values (i.e., 37 bytes for the FIC segment, 2 bytes for the FIC segment header, and 35 bytes for the FIC segment payload) are merely exemplary, and will, therefore, not limit the scope of the present invention.

FIG. 15 illustrates an exemplary bit stream syntax structure with respect to an FIC segment according to an embodiment of the present invention.

Herein, the FIC segment signifies a unit used for transmitting the FIC data. The FIC segment consists of an FIC segment header and an FIC segment payload. Referring to FIG. 15, the FIC segment payload corresponds to the portion starting from the 'for' loop statement. Meanwhile, the FIC segment header may include a FIC_type field, an error_indicator field, an FIC_seg_number field, and an FIC_last_seg_number field. A detailed description of each field will now be given.

The FIC_type field is a 2-bit field indicating the type of the corresponding FIC.

The error_indicator field is a 1-bit field, which indicates whether or not an error has occurred within the FIC segment during data transmission. If an error has occurred, the value of the error_indicator field is set to '1'. More specifically, when an error that has failed to be recovered still remains during the configuration process of the FIC segment, the error_indicator field value is set to '1'. The error_indicator field enables the receiving system to recognize the presence of an error within the FIC data.

The FIC_seg_number field is a 4-bit field. Herein, when a single FIC body is divided into a plurality of FIC segments and transmitted, the FIC_seg_number field indicates the number of the corresponding FIC segment.

Finally, the FIC_last_seg_number field is also a 4-bit field. The FIC_last_seg_number field indicates the number of the last FIC segment within the corresponding FIC body.

FIG. 16 illustrates an exemplary bit stream syntax structure with respect to a payload of an FIC segment according to the present invention, when an FIC type field value is equal to '0'.

According to the embodiment of the present invention, the payload of the FIC segment is divided into 3 different regions.

A first region of the FIC segment payload exists only when the FIC_seg_number field value is equal to '0'. Herein, the first region may include a current_next_indicator field, an ESG_version field, and a transport_stream_id field. However, depending upon the embodiment of the present invention, it may be assumed that each of the 3 fields exists regardless of the FIC_seg_number field.

The current_next_indicator field is a 1-bit field. The current_next_indicator field acts as an indicator identifying whether the corresponding FIC data carry MH ensemble configuration information of an MH frame including the current FIC segment, or whether the corresponding FIC data carry MH ensemble configuration information of a next MH frame.

The ESG_version field is a 5-bit field indicating ESG version information. Herein, by providing version information on the service guide providing channel of the corresponding ESG, the ESG_version field enables the receiving system to notify whether or not the corresponding ESG has been updated.

Finally, the transport_stream_id field is a 16-bit field acting as a unique identifier of a broadcast stream through which the corresponding FIC segment is being transmitted.

A second region of the FIC segment payload corresponds to an ensemble loop region, which includes an ensemble_id field, an SI_version field, and a num_channel field.

More specifically, the ensemble_id field is an 8-bit field indicating identifiers of an MH ensemble through which MH services are transmitted. The MH services will be described in more detail in a later process. Herein, the ensemble_id field binds the MH services and the MH ensemble.

The SI_version field is a 4-bit field indicating version information of SI data included in the corresponding ensemble, which is being transmitted within the RS frame.

Finally, the num_channel field is an 8-bit field indicating the number of virtual channel being transmitted via the corresponding ensemble.

A third region of the FIC segment payload a channel loop region, which includes a channel_type field, a channel_activity field, a CA_indicator field, a stand_alone_service_indicator field, a major_channel_num field, and a minor_channel_num field.

The channel_type field is a 5-bit field indicating a service type of the corresponding virtual channel. For example, the channel_type field may indicates an audio/video channel, an audio/video and data channel, an audio-only channel, a data-only channel, a file download channel, an ESG delivery channel, a notification channel, and so on.

The channel_activity field is a 2-bit field indicating activity information of the corresponding virtual channel. More specifically, the channel_activity field may indicate whether the current virtual channel is providing the current service.

The CA_indicator field is a 1-bit field indicating whether or not a conditional access (CA) is applied to the current virtual channel.

The stand_alone_service_indicator field is also a 1-bit field, which indicates whether the service of the corresponding virtual channel corresponds to a stand alone service.

The major_channel_num field is an 8-bit field indicating a major channel number of the corresponding virtual channel.

Finally, the minor_channel_num field is also an 8-bit field indicating a minor channel number of the corresponding virtual channel.

Service Table Map

FIG. 17 illustrates an exemplary bit stream syntax structure of a service map table (hereinafter referred to as "SMT") according to the present invention.

According to the embodiment of the present invention, the SMT is configured in an MPEG-2 private section format. However, this will not limit the scope and spirit of the present invention. The SMT according to the embodiment of the present invention includes description information for each virtual channel within a single MH ensemble. And, additional information may further be included in each descriptor area.

Herein, the SMT according to the embodiment of the present invention includes at least one field and is transmitted from the transmitting system to the receiving system.

As described in FIG. 3, the SMT section may be transmitted by being included in the MH TP within the RS frame. In this case, each of the RS frame decoders 170 and 180, shown in FIG. 1, decodes the inputted RS frame, respectively. Then, each of the decoded RS frames is outputted to the respective RS frame handler 211 and 212. Thereafter, each RS frame handler 211 and 212 identifies the inputted RS frame by row units, so as to create an MH TP, thereby outputting the created MH TP to the MH TP handler 213.

When it is determined that the corresponding MH TP includes an SMT section based upon the header in each of the inputted MH TP, the MH TP handler 213 parses the corresponding SMT section, so as to output the SI data within the parsed SMT section to the physical adaptation control signal handler 216. However, this is limited to when the SMT is not encapsulated to IP datagrams.

Meanwhile, when the SMT is encapsulated to IP datagrams, and when it is determined that the corresponding MH TP includes an SMT section based upon the header in each of the inputted MH TP, the MH TP handler 213 outputs the SMT section to the IP network stack 220. Accordingly, the IP network stack 220 performs IP and UDP processes on the inputted SMT section and, then, outputs the processed SMT section to the SI handler 240. The SI handler 240 parses the inputted SMT section and controls the system so that the parsed SI data can be stored in the storage unit 290.

The following corresponds to example of the fields that may be transmitted through the SMT.

A table_id field corresponds to an 8-bit unsigned integer number, which indicates the type of table section. The table_id field allows the corresponding table to be defined as the service map table (SMT).

An ensemble_id field is an 8-bit unsigned integer field, which corresponds to an ID value associated to the corresponding MH ensemble. Herein, the ensemble_id field may be assigned with a value ranging from range '0x00' to '0x3F'. It is preferable that the value of the ensemble_id field is derived from the parade_id of the TPC data, which is carried from the baseband processor of MH physical layer subsystem. When the corresponding MH ensemble is transmitted through (or carried over) the primary RS frame, a value of '0' may be used for the most significant bit (MSB), and the remaining 7 bits are used as the parade_id value of the associated MH parade (i.e., for the least significant 7 bits). Alternatively, when the corresponding MH ensemble is transmitted through (or carried over) the secondary RS frame, a value of '1' may be used for the most significant bit (MSB).

A num_channels field is an 8-bit field, which specifies the number of virtual channels in the corresponding SMT section.

Meanwhile, the SMT according to the embodiment of the present invention provides information on a plurality of virtual channels using the 'for' loop statement.

A major_channel_num field corresponds to an 8-bit field, which represents the major channel number associated with the corresponding virtual channel. Herein, the major_channel_num field may be assigned with a value ranging from '0x00' to '0xFF'.

A minor_channel_num field corresponds to an 8-bit field, which represents the minor channel number associated with the corresponding virtual channel. Herein, the minor_channel_num field may be assigned with a value ranging from '0x00' to '0xFF'.

A short_channel_name field indicates the short name of the virtual channel. The service id field is a 16-bit unsigned integer number (or value), which identifies the virtual channel service.

A service_type field is a 6-bit enumerated type field, which designates the type of service carried in the corresponding virtual channel as defined in Table 2 below.

TABLE 2

| | |
|---|---|
| 0x00 | [Reserved] |
| 0x01 | MH_digital_television field: the virtual channel carries television programming (audio, video and optional associated data) conforming to ATSC standards. |

TABLE 2-continued

| | |
|---|---|
| 0x02 | MH_audio field: the virtual channel carries audio programming (audio service and optional associated data) conforming to ATSC standards. |
| 0x03 | MH_data_only_service field: the virtual channel carries a data service conforming to ATSC standards, but no video or audio component. |
| 0x04 to 0xFF | [Reserved for future ATSC usage] |

A virtual_channel_activity field is a 2-bit enumerated field identifying the activity status of the corresponding virtual channel. When the most significant bit (MSB) of the virtual_channel_activity field is '1', the virtual channel is active, and when the most significant bit (MSB) of the virtual_channel_activity field is '0', the virtual channel is inactive. Also, when the least significant bit (LSB) of the virtual_channel_activity field is '1', the virtual channel is hidden (when set to 1), and when the least significant bit (LSB) of the virtual_channel_activity field is '0', the virtual channel is not hidden.

A num components field is a 5-bit field, which specifies the number of IP stream components in the corresponding virtual channel.

An IP_version_flag field corresponds to a 1-bit indicator. More specifically, when the value of the IP_version_flag field is set to '1', this indicates that a source_IP_address field, a virtual_channel_target_IP_address field, and a component_target IP_address field are IPv6 addresses. Alternatively, when the value of the IP_version_flag field is set to '0', this indicates that the source_IP_address field, the virtual_channel_target_IP_address field, and the component_target_IP_address field are IPv4.

A source_IP_address flag field is a 1-bit Boolean flag, which indicates, when set, that a source IP address of the corresponding virtual channel exist for a specific multicast source.

A virtual_channel_target_IP_address flag field is a 1-bit Boolean flag, which indicates, when set, that the corresponding IP stream component is delivered through IP datagrams with target IP addresses different from the virtual_channel_target_IP_address. Therefore, when the flag is set, the receiving system (or receiver) uses the component_target_IP_address as the target IP_address in order to access the corresponding IP stream component. Accordingly, the receiving system (or receiver) may ignore the virtual_channel_target_IP_address field included in the num_channels loop.

The source_IP_address field corresponds to a 32-bit or 128-bit field. Herein, the source_IP_address field will be significant (or present), when the value of the source_IP_address flag field is set to '1'. However, when the value of the source_IP_address flag field is set to '0', the source_IP_address field will become insignificant (or absent). More specifically, when the source_IP_address flag field value is set to '1', and when the IP_version_flag field value is set to '0', the source_IP_address field indicates a 32-bit IPv4 address, which shows the source of the corresponding virtual channel. Alternatively, when the IP_version_flag field value is set to '1', the source_IP_address field indicates a 128-bit IPv6 address, which shows the source of the corresponding virtual channel.

The virtual_channel_target_IP_address field also corresponds to a 32-bit or 128-bit field. Herein, the virtual_channel_target_IP_address field will be significant (or present), when the value of the virtual_channel_target_IP_address flag field is set to '1'. However, when the value of the virtual_channel_target_IP_address flag field is set to '0', the virtual_channel_target_IP_address field will become insignificant (or absent). More specifically, when the virtual_channel_target_IP_address flag field value is set to '1', and when the IP_version_flag field value is set to '0', the virtual_channel_target_IP_address field indicates a 32-bit target IPv4 address associated to the corresponding virtual channel. Alternatively, when the virtual_channel_target_IP_address flag field value is set to '1', and when the IP_version_flag field value is set to '1', the virtual_channel_target_IP_address field indicates a 64-bit target IPv6 address associated to the corresponding virtual channel. If the virtual_channel_target_IP_address field is insignificant (or absent), the component_target_IP_address field within the num_channels loop should become significant (or present). And, in order to enable the receiving system to access the IP stream component, the component_target_IP_address field should be used.

Meanwhile, the SMT according to the embodiment of the present invention uses a 'for' loop statement in order to provide information on a plurality of components.

Herein, an RTP_payload_type field, which is assigned with 7 bits, identifies the encoding format of the component based upon Table 3 shown below. When the IP stream component is not encapsulated to RTP, the RTP_payload_type field shall be ignored (or deprecated).

Table 3 below shows an example of an RTP_payload_type.

TABLE 3

| RTP_payload_type | Meaning |
|---|---|
| 35 | AVC video |
| 36 | MH audio |
| 37 to 72 | [Reserved for future ATSC use] |

For example, when the RTP_payload_type field is assigned with a value of '35', this indicates that the corresponding IP stream component is a video component encoded by an AVC method. Alternatively, when the RTP_payload_type field is assigned with a value of '36', this indicates that the corresponding IP stream component is an audio component encoded by an MH method.

A component_target_IP_address flag field is a 1-bit Boolean flag, which indicates, when set, that the corresponding IP stream component is delivered through IP datagrams with target IP addresses different from the virtual_channel_target_IP_address. Furthermore, when the component_target_IP_address flag is set, the receiving system (or receiver) uses the component_target_IP_address field as the target IP address for accessing the corresponding IP stream component. Accordingly, the receiving system (or receiver) will ignore the virtual_channel_target_IP_address field included in the num_channels loop.

The component_target_IP_address field corresponds to a 32-bit or 128-bit field. Herein, when the value of the IP_version_flag field is set to '0', the component_target_IP_address field indicates a 32-bit target IPv4 address associated to the corresponding IP stream component. And, when the value of the IP_version_flag field is set to '1', the component_target_IP_address field indicates a 128-bit target IPv6 address associated to the corresponding IP stream component.

A port_num_count field is a 6-bit field, which indicates the number of UDP ports associated with the corresponding IP stream component. A target UDP port number value starts from the target_UDP_port_num field value and increases (or is incremented) by 1. For the RTP stream, the target UDP port number should start from the target_UDP_port_num field value and shall increase (or be incremented) by 2. This is to incorporate RTCP streams associated with the RTP streams.

A target_UDP_port_num field is a 16-bit unsigned integer field, which represents the target UDP port number for the corresponding IP stream component. When used for RTP streams, the value of the target_UDP_port_num field shall correspond to an even number. And, the next higher value shall represent the target UDP port number of the associated RTCP stream.

A component_level_descriptor( ) represents zero or more descriptors providing additional information on the corresponding IP stream component.

A virtual_channel_level_descriptor( ) represents zero or more descriptors providing additional information for the corresponding virtual channel.

An ensemble_level_descriptor( ) represents zero or more descriptors providing additional information for the MH ensemble, which is described by the corresponding SMT.

FIG. 18 illustrates an exemplary bit stream syntax structure of an MH audio descriptor according to the present invention.

When at least one audio service is present as a component of the current event, the MH_audio_descriptor( ) shall be used as a component_level_descriptor of the SMT. The MH_audio_descriptor( ) may be capable of informing the system of the audio language type and stereo mode status. If there is no audio service associated with the current event, then it is preferable that the MH_audio_descriptor( ) is considered to be insignificant (or absent) for the current event.

Each field shown in the bit stream syntax of FIG. 18 will now be described in detail.

A descriptor_tag field is an 8-bit unsigned integer having a TBD value, which indicates that the corresponding descriptor is the MH_audio_descriptor( ).

A descriptor_length field is also an 8-bit unsigned integer, which indicates the length (in bytes) of the portion immediately following the descriptor_length field up to the end of the MH_audio_descriptor( ).

A channel configuration field corresponds to an 8-bit field indicating the number and configuration of audio channels. The values ranging from '1' to '6' respectively indicate the number and configuration of audio channels as given for "Default bit stream index number" in Table 42 of ISO/IEC 13818-7:2006. All other values indicate that the number and configuration of audio channels are undefined.

A sample_rate_code field is a 3-bit field, which indicates the sample rate of the encoded audio data. Herein, the indication may correspond to one specific sample rate, or may correspond to a set of values that include the sample rate of the encoded audio data as defined in Table A3.3 of ATSC A/52B.

A bit_rate_code field corresponds to a 6-bit field. Herein, among the 6 bits, the lower 5 bits indicate a nominal bit rate. More specifically, when the most significant bit (MSB) is '0', the corresponding bit rate is exact. On the other hand, when the most significant bit (MSB) is '0', the bit rate corresponds to an upper limit as defined in Table A3.4 of ATSC A/53B.

An ISO_639_language_code field is a 24-bit (i.e., 3-byte) field indicating the language used for the audio stream component, in conformance with ISO 639.2/B [x]. When a specific language is not present in the corresponding audio stream component, the value of each byte will be set to '0x00'.

FIG. 19 illustrates an exemplary bit stream syntax structure of an MH current event descriptor according to the present invention.

The MH_current_event_descriptor( ) shall be used as the virtual_channel_level_descriptor( ) within the SMT. Herein, the MH_current_event_descriptor( ) provides basic information on the current event (e.g., the start time, duration, and title of the current event, etc.), which is transmitted via the respective virtual channel.

The fields included in the MH_current_event_descriptor( ) will now be described in detail.

A descriptor_tag field corresponds to an 8-bit unsigned integer having the value TBD, which identifies the current descriptor as the MH_current_event_descriptor( ).

A descriptor_length field also corresponds to an 8-bit unsigned integer, which indicates the length (in bytes) of the portion immediately following the descriptor_length field up to the end of the MH_current_event_descriptor( ).

A current_event_start_time field corresponds to a 32-bit unsigned integer quantity. The current_event_start_time field represents the start time of the current event and, more specifically, as the number of GPS seconds since 00:00:00 UTC, Jan. 6, 1980.

A current_event_duration field corresponds to a 24-bit field. Herein, the current_event_duration field indicates the duration of the current event in hours, minutes, and seconds (wherein the format is in 6 digits, 4-bit BCD=24 bits).

A title_length field specifies the length (in bytes) of a title_text field. Herein, the value '0' indicates that there are no titles existing for the corresponding event.

The title_text field indicates the title of the corresponding event in event title in the format of a multiple string structure as defined in ATSC A/65C [x].

FIG. 20 illustrates an exemplary bit stream syntax structure of an MH next event descriptor according to the present invention.

The optional MH_next_event_descriptor( ) shall be used as the virtual_channel_level_descriptor( ) within the SMT. Herein, the MH_next_event_descriptor( ) provides basic information on the next event (e.g., the start time, duration, and title of the next event, etc.), which is transmitted via the respective virtual channel.

The fields included in the MH_next_event_descriptor( ) will now be described in detail.

A descriptor_tag field corresponds to an 8-bit unsigned integer having the value TBD, which identifies the current descriptor as the MH_next_event_descriptor( ).

A descriptor_length field also corresponds to an 8-bit unsigned integer, which indicates the length (in bytes) of the portion immediately following the descriptor_length field up to the end of the MH_next_event_descriptor( ).

A next_event_start_time field corresponds to a 32-bit unsigned integer quantity. The next_event_start_time field represents the start time of the next event and, more specifically, as the number of GPS seconds since 00:00:00 UTC, Jan. 6, 1980.

A next_event_duration field corresponds to a 24-bit field. Herein, the next_event_duration field indicates the duration of the next event in hours, minutes, and seconds (wherein the format is in 6 digits, 4-bit BCD=24 bits).

A title_length field specifies the length (in bytes) of a title_text field. Herein, the value '0' indicates that there are no titles existing for the corresponding event.

The title_text field indicates the title of the corresponding event in event title in the format of a multiple string structure as defined in ATSC A/65C [x].

FIG. 21 illustrates an exemplary bit stream syntax structure of an MH system time descriptor according to the present invention.

The MH_system_time_descriptor( ) shall be used as the ensemble_level_descriptor( ) within the SMT. Herein, the MH_system_time_descriptor( ) provides information on current time and date. The MH_system_time_descriptor( ) also provides information on the time zone in which the transmitting system (or transmitter) transmitting the corresponding broadcast stream is located, while taking into consideration the mobile/portable characteristics of the MH service data.

The fields included in the MH_system_time_descriptor( ) will now be described in detail.

A descriptor_tag field corresponds to an 8-bit unsigned integer having the value TBD, which identifies the current descriptor as the MH_system_time_descriptor( ).

A descriptor_length field also corresponds to an 8-bit unsigned integer, which indicates the length (in bytes) of the portion immediately following the descriptor_length field up to the end of the MH_system_time_descriptor( ).

A system_time field corresponds to a 32-bit unsigned integer quantity. The system_time field represents the current system time and, more specifically, as the number of GPS seconds since 00:00:00 UTC, Jan. 6, 1980.

A GPS_UTC_offset field corresponds to an 8-bit unsigned integer, which defines the current offset in whole seconds between GPS and UTC time standards. In order to convert GPS time to UTC time, the GPS_UTC_offset is subtracted from GPS time. Whenever the International Bureau of Weights and Measures decides that the current offset is too far in error, an additional leap second may be added (or subtracted). Accordingly, the GPS_UTC_offset field value will reflect the change.

A time_zone_offset_polarity field is a 1-bit field, which indicates whether the time of the time zone, in which the broadcast station is located, exceeds (or leads or is faster) or falls behind (or lags or is slower) than the UTC time. When the value of the time_zone_offset_polarity field is equal to '0', this indicates that the time on the current time zone exceeds the UTC time. Therefore, a time_zone_offset field value is added to the UTC time value. Conversely, when the value of the time_zone_offset_polarity field is equal to '1', this indicates that the time on the current time zone falls behind the UTC time. Therefore, the time_zone_offset field value is subtracted from the UTC time value.

The time_zone_offset field is a 31-bit unsigned integer quantity. More specifically, the time_zone_offset field represents, in GPS seconds, the time offset of the time zone in which the broadcast station is located, when compared to the UTC time.

A daylight_savings field corresponds to a 16-bit field providing information on the Summer Time (i.e., the Daylight Savings Time).

A time_zone field corresponds to a (5×8)-bit field indicating the time zone, in which the transmitting system (or transmitter) transmitting the corresponding broadcast stream is located.

Figure 22:
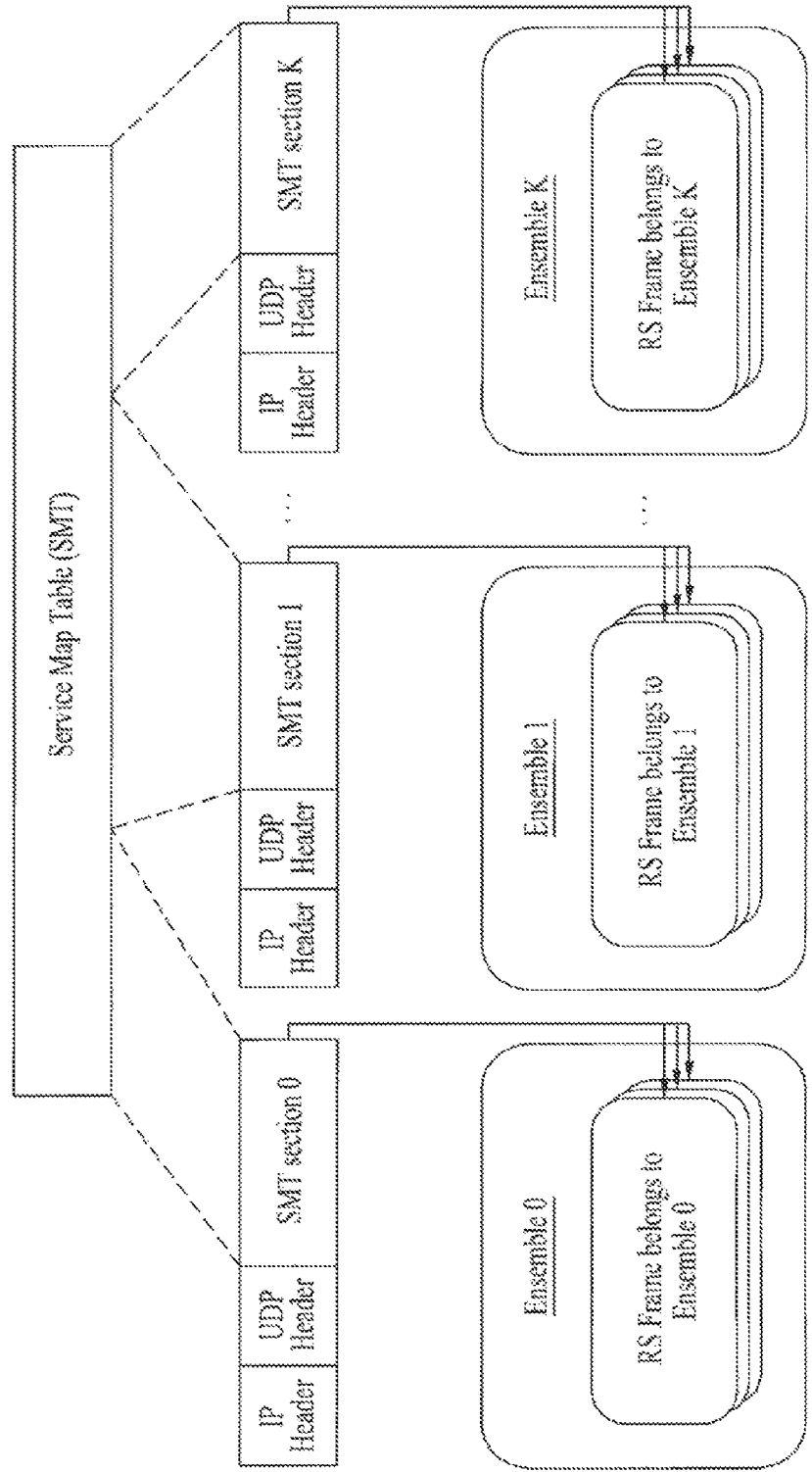
FIG. 22 illustrates segmentation and encapsulation processes of a service map table according to the present invention.

FIG. 22 illustrates segmentation and encapsulation processes of a service map table (SMT) according to the present invention.

According to the present invention, the SMT is encapsulated to UDP, while including a target IP address and a target UDP port number within the IP datagram. More specifically, the SMT is first segmented into a predetermined number of sections, then encapsulated to a UDP header, and finally encapsulated to an IP header.

In addition, the SMT section provides signaling information on all virtual channel included in the MH ensemble including the corresponding SMT section. At least one SMT section describing the MH ensemble is included in each RS frame included in the corresponding MH ensemble. Finally, each SMT section is identified by an ensemble_id included in each section.

According to the embodiment of the present invention, by informing the receiving system of the target IP address and target UDP port number, the corresponding data (i.e., target IP address and target UDP port number) may be parsed without having the receiving system to request for other additional information.

Figure 23:
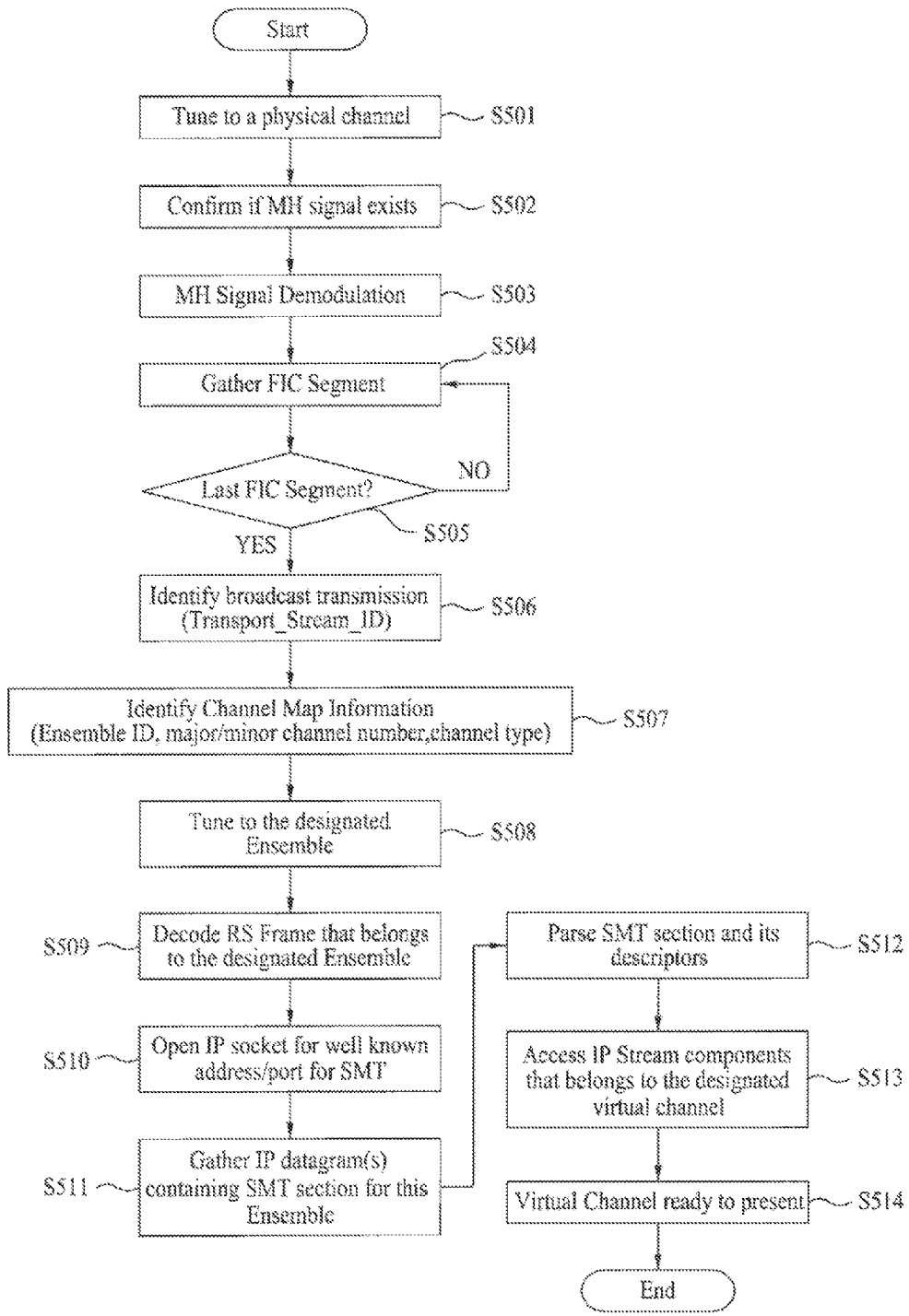
FIG. 23 illustrates a flow chart for accessing a virtual channel using FIC and SMT according to the present invention.

FIG. 23 illustrates a flow chart for accessing a virtual channel using FIC and SMT according to the present invention.

More specifically, a physical channel is tuned (S501). And, when it is determined that an MH signal exists in the tuned physical channel (S502), the corresponding MH signal is demodulated (S503). Additionally, FIC segments are grouped from the demodulated MH signal in sub-frame units (S504 and S505).

According to the embodiment of the present invention, an FIC segment is inserted in a data group, so as to be transmitted. More specifically, the FIC segment corresponding to each data group described service information on the MH ensemble to which the corresponding data group belongs. When the FIC segments are grouped in sub-frame units and, then, deinterleaved, all service information on the physical channel through which the corresponding FIC segment is transmitted may be acquired. Therefore, after the tuning process, the receiving system may acquire channel information on the corresponding physical channel during a sub-frame period. Once the FIC segments are grouped, in 5504 and 5505, a broadcast stream through which the corresponding FIC segment is being transmitted is identified (S506). For example, the broadcast stream may be identified by parsing the transport_stream_id field of the FIC body, which is configured by grouping the FIC segments.

Furthermore, an ensemble identifier, a major channel number, a minor channel number, channel type information, and so on, are extracted from the FIC body (S507). And, by using the extracted ensemble information, only the slots corresponding to the designated ensemble are acquired by using the time-slicing method, so as to configure an ensemble (S508).

Subsequently, the RS frame corresponding to the designated ensemble is decoded (S509), and an IP socket is opened for SMT reception (S510).

According to the example given in the embodiment of the present invention, the SMT is encapsulated to UDP, while including a target IP address and a target UDP port number within the IP datagram. More specifically, the SMT is first segmented into a predetermined number of sections, then encapsulated to a UDP header, and finally encapsulated to an IP header. According to the embodiment of the present invention, by informing the receiving system of the target IP address and target UDP port number, the receiving system parses the SMT sections and the descriptors of each SMT section without requesting for other additional information (S511).

The SMT section provides signaling information on all virtual channel included in the MH ensemble including the corresponding SMT section. At least one SMT section describing the MH ensemble is included in each RS frame included in the corresponding MH ensemble. Also, each SMT section is identified by an ensemble_id included in each section.

Furthermore each SMT provides IP access information on each virtual channel subordinate to the corresponding MH ensemble including each SMT. Finally, the SMT provides IP stream component level information required for the servicing of the corresponding virtual channel.

Therefore, by using the information parsed from the SMT, the IP stream component belonging to the virtual channel requested for reception may be accessed (S513). Accordingly, the service associated with the corresponding virtual channel is provided to the user (S514).

Meanwhile, when the IP stream component is encapsulated to RTP and then received, the RTP_payload_type field within the SMT indicates the encoding format of the IP stream, which is carried in the payload of the corresponding RTP packet. At this point, when the value of the RTP_payload_type field is within the range of '35' to '72', the encoding format of the corresponding IP stream component may be known by referring only the RTP_payload_type field value. This is because the receiving system and transmitting system are already informed of the significance of each field value based upon an agreement between the receiving system and the transmitting system.

For example, when the RTP_payload_type field is assigned with a value of '35', this indicates that the corresponding IP stream component is a video component encoded by an AVC method. Alternatively, when the RTP_payload_type field is assigned with a value of '36', this indicates that the corresponding IP stream component is an audio component encoded by an MH method.

On the other hand, the RTP_payload_type field may be assigned with one of the values ranging from '96' to '127'. According to the present invention, the value range from '96' to '127' is referred to a dynamic range.

When the RTP_payload_type field is assigned with any one value within the dynamic range, the receiving system is unable to known the encoding format of the corresponding IP stream component by referring only to the RTP_payload_type field value.

In order to resolve this problem, when the RTP_payload_type field is assigned with a value within the dynamic range, the present invention transmits encoding format information (or an encoding parameter) corresponding to the respective the RTP_payload_type field value.

In this example of the present invention, the encoding format information is transmitted in the form of a descriptor. In order to simplify the description of the present invention, the descriptor-type encoding format information will be referred to as an RTP payload type descriptor MH RTP_payload_type Descriptor( ) Herein, the RTP payload type descriptor may be transmitted as any one of an ensemble level descriptor, a virtual channel level descriptor, and a component level descriptor within at least one table of the SMT. According to the embodiment of the present invention, the RTP payload type descriptor will be transmitted as the component level descriptor.

Also, according to the embodiment of the present invention, the RTP payload type descriptor expresses (or describes) the encoding format information of the corresponding IP stream component as a MIME type. Therefore, the receiving system may be able to extract and analyze the text-type encoding format information expressed as a MIME type.

FIG. 24 illustrates an exemplary bit stream syntax structure of an MH RTP payload type descriptor according to the present invention.

The MH_RTP_payload_type_descriptor( ) specifies the RTP payload type (i.e., the encoding format of the IP component assigned to the payload). Yet, the MH_RTP_payload_type_descriptor( ) exists (or is present) only when the value of the RTP_payload_type field included in the num components loop of the SMT is within the dynamic range (i.e., the range of '96' to '127'). When present, the MH_RTP_payload_type_descriptor( ) shall be used as a component_level_descriptor of the SMT. The MH_RTP_payload_type_descriptor translates (or matches) a dynamic RTP_payload_type field value into (or with) a MIME type. Accordingly, the receiving system (or receiver) may collect (or gather) the encoding format of the IP stream component, which is encapsulated in RTP.

The fields included in the MH_RTP_payload_type_descriptor( ) will now be described in detail.

A descriptor_tag field corresponds to an 8-bit unsigned integer having the value TBD, which identifies the current descriptor as the MH_RTP_payload_type_descriptor( ).

A descriptor_length field also corresponds to an 8-bit unsigned integer, which indicates the length (in bytes) of the portion immediately following the descriptor_length field up to the end of the MH_RTP_payload_type_descriptor( ).

An RTP_payload_type field corresponds to a 7-bit field, which identifies the encoding format of the IP stream component. Herein, the value of the RTP_payload_type field is in the dynamic range of '96' to '127'. Herein, the RTP_payload_type field of the MH_RTP_payload_type_descriptor( ) and the RTP_payload_type field included in the num components loop of the SMT is assigned with the same value. More specifically, the value of the RTP_payload_type field included in the num components loop of the SMT may be used as link information for being mapped with the MH_RTP_payload_type_descriptor( ).

An MIME_type_length field specifies the length (in bytes) of an MIME_type field.

The MIME_type field indicates the MIME type corresponding to the encoding format of the IP stream component, which is described by the MH_RTP_payload_type_descriptor( ).

Hereinafter, the process of acquiring the encoding format of the IP stream component RTP-packetized and received will be described in detail.

For example, when the SMT is encapsulated in an IP datagram, the MH TP handler 213 determines based upon the header of each inputted MH TP whether or not the corresponding MH TP includes an SMT section. Then, when the MH TP handler 213 determines that the corresponding MH TP includes an SMT section, the corresponding MH TP is outputted to the IP network stack 220. Then, the IP network stack 220 performs IP and UDP processes on the SMT section, thereby outputting the processed SMT section to the SI handler 240. The SI handler 240 then parses the inputted SMT section and controls the system so that the parsed SI is stored in the storage unit 290.

At this point, when the value of the RTP_payload_type field of the SMT is within the range of '35' and '72', the SI handler 240 stores the encoding format respective of the corresponding RTP_payload_type field value to the storage unit 290. Herein, the encoding format information corresponding to the respective values within the range of '35' and '72' may already be stored in a table format within the storage unit 290 of the receiving system. In this case, the encoding format information respective of the corresponding RTP_payload_type field value may be read from the pre-formed table, so as to be linked with the corresponding IP stream component and then stored in the storage unit 290.

Furthermore, when the value of the RTP_payload_type field of the SMT is within the range of '92' and '127', the SI handler 240 parses the MH_RTP_payload_type_descriptor( ) which is received as the component_level_descriptor of the SMT, thereby outputting the MIME_type( ) field value to the MIME handler 260. Herein, the MIME_type( ) field is received by being repeated as many times as the length of the MIME_type_length field. Thereafter, the MIME handler 260 parses the MIME_type field, so as to acquire the encoding format (or encoding parameter) respective of the corresponding IP stream component. Herein, the encoding format respective of the corresponding IP stream component is written in a text format. The MIME handler 260 outputs the acquired encoding format respective of the corresponding IP stream component to the SI handler 240. Subsequently, the SI handler 240 either stores the encoding format respective of the corresponding IP stream component to the storage unit 290 or outputs the encoding format respective of the corresponding IP stream component to the A/V decoder 310.

Figure 25:
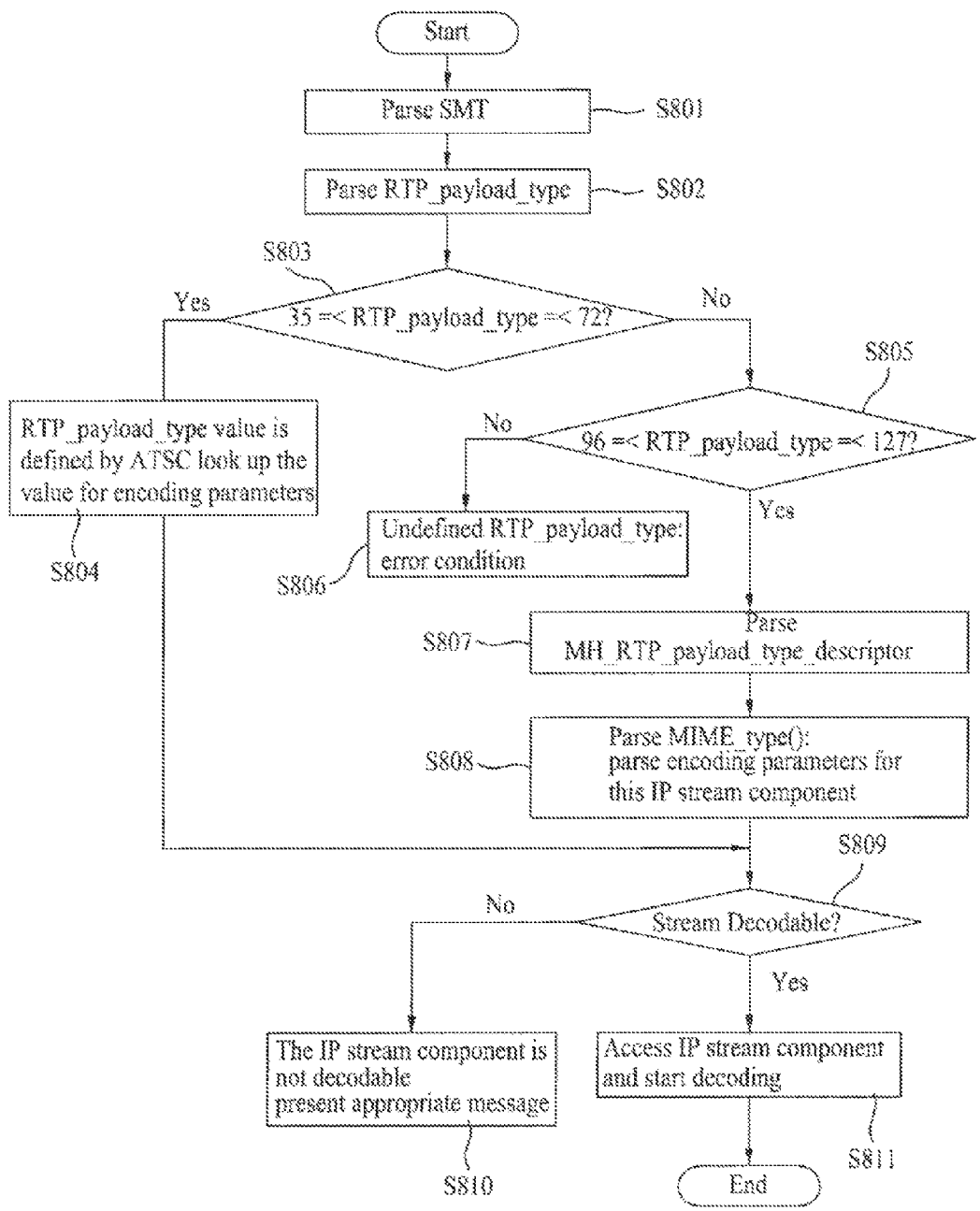
FIG. 25 illustrates an exemplary method for accessing an IP stream component based upon an RTP payload type according to an embodiment of the present invention.

FIG. 25 illustrates an exemplary method for accessing an IP stream component based upon an RTP_payload_type according to an embodiment of the present invention. More specifically, the SMT is parsed (S801), so as to extract the RTP_payload_type field value of the SMT (S802). Then, it is determined whether or not the RTP_payload_type field value is assigned with a value within the range of '35' and '72' (S803). If it is determine that the RTP_payload_type field value is assigned with any one of the values ranging from '35' to '72', the encoding format respective of the corresponding value is either stored in the storage unit 290 or outputted to the A/V decoder 310 (S804). Herein, it is assumed that the receiving system is pre-informed of the definition of the encoding format corresponding to a value within the range of '35' and '72'.

However, when it is determined that the RTP_payload_type field value is not within the range of '35' and '72', it is then determined whether or not the RTP_payload_type field value is within the dynamic range (i.e., within the range of '92' to '127') (S805). If the RTP_payload_type field value is not within the range of '92' to '127', the RTP_payload_type field determined to be assigned with an undefined value. Therefore, an error message is displayed (S806). Alternatively, if the RTP_payload_type field value is within the dynamic range of '92' to '127', the MH_RTP_payload_type_descriptor( ) which is received as the component_level_descriptor of the SMT, is parsed (S807). Then, the value of the MIME_type( ) field of the MH_RTP_payload_type_descriptor( ) is parsed, so as to acquire the encoding format (or encoding parameter) respective of the corresponding IP stream component (S808). Herein, the MIME_type( ) field is received by being repeated as many times as the length of the MIME_type_length field.

When the encoding format respective of the IP stream component is acquired, it is determined whether or not the IP stream component is decodable (S809). When it is determined, in step 809, that the IP stream component is not decodable, an appropriate message is displayed (S810). Conversely, when it is determined, in step 809, that the IP stream component is decodable, the corresponding IP stream component is accessed, and reference is made to the encoding format information extracted in any one of step 804 and step 808 in order to perform a decoding process on the accessed IP stream component (S811).

As described above, the digital broadcasting system and the data processing method according to the present invention have the following advantages. The present invention provides information on an encoding parameter (i.e., encoding format information) of each IP stream component within the corresponding virtual channel using the service map table (SMT). Most particularly, the present invention may also provide encoding format information of an IP stream component, which is not defined by the digital broadcast receiving and transmitting system, using an RTP payload type descriptor of the corresponding SMT. At this point, the RTP payload type descriptor may map an RTP_payload_type field value within a dynamic range to the encoding format information of the IP stream component expressed as a MIME_type.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for receiving a broadcast signal, the method comprising:
receiving the broadcast signal, the broadcast signal including a data unit;
demodulating the broadcast signal;
decoding first signaling data from the demodulated broadcast signal, the first signaling data including fast service acquisition information;
decoding multiplexed data from the demodulated broadcast signal, wherein the multiplexed data includes second signaling data and service data, and the second signaling data is carried in a payload of at least user datagram protocol (UDP) or Internet Protocol (IP) packets,
wherein the second signaling data includes:
service identifier information that uniquely identifies a service of the service data;
destination IP address information for receiving the service; and
a destination UDP port number for receiving the service;
decoding the service data based on the decoded second signaling data.

2. The method of claim 1, wherein the data unit includes a first region and a second region, wherein the first region includes first known data and signaling information, and the second region includes second known data and broadcast data.

* * * * *